(12) United States Patent
Nishiwaki et al.

(10) Patent No.: US 10,593,793 B2
(45) Date of Patent: Mar. 17, 2020

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tatsuya Nishiwaki, Nonoichi Ishikawa (JP); Kohei Oasa, Nonoichi Ishikawa (JP); Hiroshi Matsuba, Fujisawa Kanagawa (JP); Kikuo Aida, Nomi Ishikawa (JP); Hung Hung, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/126,668

(22) Filed: Sep. 10, 2018

(65) Prior Publication Data

US 2019/0288103 A1    Sep. 19, 2019

(30) Foreign Application Priority Data

Mar. 16, 2018  (JP) ................................. 2018-050096

(51) Int. Cl.
*H01L 29/66* (2006.01)
*H01L 29/78* (2006.01)
(Continued)

(52) U.S. Cl.
CPC ...... *H01L 29/7813* (2013.01); *H01L 29/0696* (2013.01); *H01L 29/086* (2013.01);
(Continued)

(58) Field of Classification Search
CPC ............. H01L 29/7813; H01L 29/0696; H01L 29/086; H01L 29/0865; H01L 29/0882
See application file for complete search history.

(56) References Cited

U.S. PATENT DOCUMENTS 9,478,614 B2    10/2016  Onozawa et al.
2007/0018241 A1*  1/2007  Amali ............... H01L 29/66719
                                                          257/330
(Continued)

FOREIGN PATENT DOCUMENTS

JP         5560991 B2    7/2014
JP         5672766 B2    2/2015
JP         5987990 B2    9/2016

*Primary Examiner* — Phuc T Dang
(74) *Attorney, Agent, or Firm* — Foley & Lardner LLP

(57) ABSTRACT

A semiconductor device according to an embodiment includes: a first semiconductor region of a first conductive type; a base region of a second conductive type; gate electrodes penetrating through the base region to reach the first semiconductor region; gate insulating films around the plurality of gate electrodes; a first region having a source region of the first conductive type, among a plurality of regions between the plurality of gate insulating films; a second region not having the source region among the plurality of regions, the second region being located in a terminal region of the first region; a first contact of a first width in the first region and electrically connecting the base region and a source electrode; and a second contact of a second width larger than the first width, the second contact being in the second region and electrically connecting the base region and the source electrode.

13 Claims, 27 Drawing Sheets

(51) Int. Cl.
    *H01L 29/40*     (2006.01)
    *H01L 29/423*     (2006.01)
    *H01L 29/08*     (2006.01)
    *H01L 29/06*     (2006.01)
    *H01L 29/10*     (2006.01)
    *H01L 29/45*     (2006.01)

(52) U.S. Cl.
    CPC ...... *H01L 29/0865* (2013.01); *H01L 29/0882* (2013.01); *H01L 29/1095* (2013.01); *H01L 29/407* (2013.01); *H01L 29/4236* (2013.01); *H01L 29/45* (2013.01)

(56) References Cited

U.S. PATENT DOCUMENTS

| | | | | |
|---|---|---|---|---|
| 2017/0047316 A1* | 2/2017 | Katou | ................ | H01L 27/0211 |
| 2017/0125407 A1* | 5/2017 | Schulze | .......... | H01L 21/823418 |
| 2018/0240867 A1* | 8/2018 | Nitta | .................... | H01L 29/0623 |
| 2018/0286975 A1* | 10/2018 | Hatakenaka | ........ | H01L 29/7813 |
| 2018/0337172 A1* | 11/2018 | Kondo | ................ | H01L 27/0652 |

\* cited by examiner

DIODE CURRENT $I_F$ AND $V_{DS}$ IN REVERSE RECOVERY

SEMICONDUCTOR DEVICE

CROSS REFERENCE TO RELATED APPLICATIONS

This application is based upon and claims the benefit of priority from Japanese Patent Application No. 2018-050096, filed on Mar. 16, 2018; the entire contents of which are incorporated herein by reference.

FIELD

Embodiments relate to a semiconductor device.

BACKGROUND

A MOSFET (Metal-Oxide-Semiconductor Field-Effect Transistor) has an equivalent body diode between a source electrode and a drain electrode. It is required for a semiconductor device provided with the MOSFET to discharge holes accumulated in a drift region, in reverse recovery in which a current flowing through the body diode in a forward direction is changed to a current in a reverse direction. However, holes accumulated in the vicinity of a terminal region are far from a source electrode contact, and thus a current is concentrated on a contact located near the terminal region. Therefore, due to sudden voltage increase in recovery from voltage drop, there is a problem of breakdown of a gate oxide film or of breakdown of a semiconductor device due to the generation of heat.

DETAILED DESCRIPTION

Hereinbelow, a semiconductor device according to the present embodiment will be explained with reference to the drawings. In the following explanation, the same reference signs are given to elements having a roughly equivalent function and configuration, for which duplicate explanation will be given only if necessary.

In the explanation of each of the following embodiments, an n-type and a p-type correspond to a first conductive type and a second conductive type, respectively. The notations of $n^+$ and $p^+$ indicate high impurity relative to the notation without + whereas the notations of $n^-$ and $p^-$ indicate low impurity relative to the notation without −. Moreover, for example, the notation of $p^{++}$ indicates further high impurity relative to the notation of $p^+$.

First Embodiment

A semiconductor device according to a first embodiment aims to reduce hole discharge resistance in a recovery operation, by making larger the width of a contact of a source electrode in a mesa portion, in which no source regions are formed, located in a terminal region than the width of a contact of a source electrode in a mesa portion in which a source region is formed. Its details will be explained hereinbelow.

Figure 1:
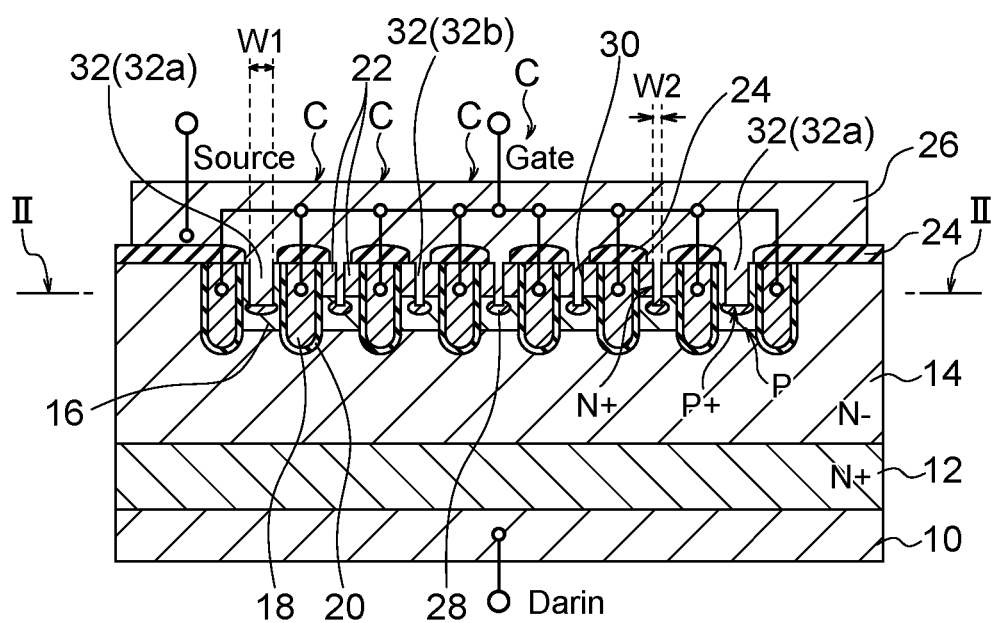
FIG. 1 is a sectional view taken on line I-I in FIG. 2 of a semiconductor device according to a first embodiment.
Figure 2:
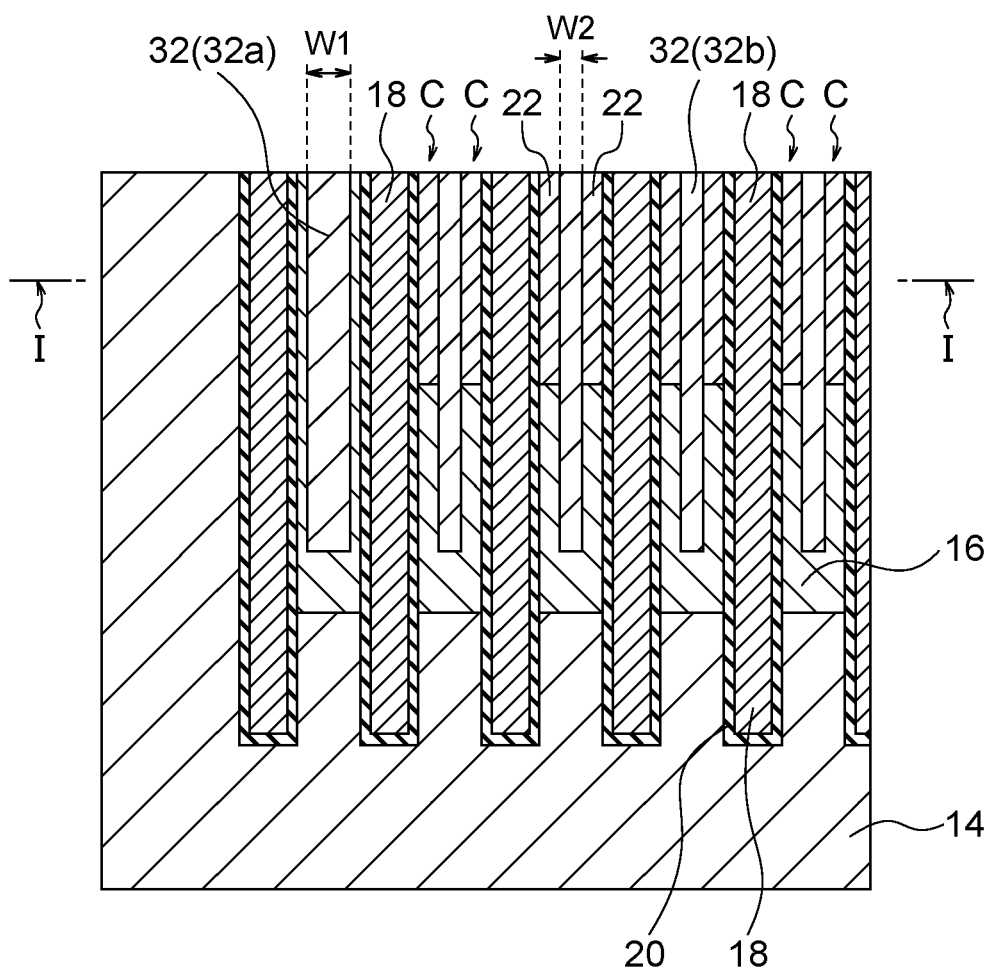
FIG. 2 is a sectional view taken on line II-II in FIG. 1 of the semiconductor device according to the first embodiment.

FIG. 1 is a sectional view taken on line I-I in FIG. 2 of a semiconductor device 1 according to the present embodiment. FIG. 2 is a sectional view taken on line II-II in FIG. 1 of the semiconductor device 1 according to the present embodiment. In other words, FIG. 1 is a sectional view of the semiconductor device 1 in an orthogonal-to-trench direction, whereas FIG. 2 is a sectional view of the semiconductor device 1 in a front surface direction.

As understood from FIGS. 1 and 2, the semiconductor device 1 according to the present embodiment is configured provided with a plurality of cells C. Although FIG. 1 shows five cells C as an example, the semiconductor device 1 can be provided with any number of cells C.

The semiconductor device 1 according to the present embodiment is configured provided with a drain electrode 10, an $n^+$-type drain region 12, an $n^-$-type drift region 14, a p-type base region 16, gate electrodes 18, gate insulating films 20, $n^+$-type source regions 22, insulating regions 24, a source electrode 26, and $p^+$-type contact regions 28. In other words, in the present embodiment, the semiconductor device 1 is configured provided with a trench-gate MOSFET.

In more specifically, the drain region 12 is formed on the drain electrode 10. The drift region 14 is formed on the drain region 12. The base region 16 is formed on the drift region 14. The drain electrode 10, the drain region 12, the drift region 14, and the base region 16 are formed so as to be shared by the plurality of cells C.

On the base region 16, a source region 22 is formed for each cell C. Moreover, for each cell C, a gate electrode 18 is formed to penetrate through the source region 22 and the base region 16 to reach the drift region 14. The gate electrode 18 extends in a trench longitudinal direction. A gate insulating film 20 is formed around each gate electrode 18 to keep insulation of the gate electrode 18 against its surrounding. In detail, the gate insulating film 20 is formed between the gate electrode 18 and the drift region 14, between the gate electrode 18 and the base region 16, and between the gate electrode 18 and the source region 22. The base region 16 is partitioned into a plurality of regions by the gate electrodes 18 and the gate insulating films 20. Hereinbelow, one partitioned region is referred to as a mesa portion.

An insulating region 24 is formed on each of the gate electrode 18, the source region 22, and the gate insulating film 20. The source electrode 26 is formed on the insulating region 24. In the present embodiment, a trench 30 that penetrates through the insulating region 24 and the source electrode 26 to reach the base region 16 is formed between the gate electrodes 18. The source electrode 26 is formed to fill the trench 30. The source electrode 26 is formed to have a trench contact structure for miniaturization of the gate structure to keep a high avalanche breakdown voltage while reducing on-resistance. In the present embodiment, part of the source electrode 26, which is embedded in the trench 30 is referred to as a contact 32.

A $p^+$-type contact region 28 is formed in the base region 16 that is situated in the bottom of the trench 30. The contact region 28 is formed to have higher impurity concentration than the base region 16 to reduce connection resistance between the contact 32 of the source electrode 26 and the base region 16. For this reason, the contact region 28 can be omitted theoretically.

In the semiconductor device 1 according to the present embodiment, although the source region 22 is not formed in a mesa portion in the vicinity of a terminal region, the contact 32 of the source electrode 26 is formed in this mesa portion. Hereinbelow, the contact 32 in the mesa portion, in the vicinity of the terminal region, in which the source region 22 is not formed, is referred to as a contact 32a, whereas the contact 32 in the mesa portion, not in the vicinity of the terminal region, in which the source region 22 is formed, is referred to as a contact 32b, according to need.

A width W1 of the contact 32a in the mesa portion in the vicinity of the terminal region is larger than a width W2 of the contact 32b in the mesa portion in which the source region 22 is formed. In other words, the width W1 of the contact 32a in the mesa portion which is in the vicinity of the terminal region and which does not constitute the cell C is larger than the width W2 of the contact 32b in the mesa portion which constitutes the cell C.

The reason why the cell C is not formed in the mesa portion in the vicinity of the terminal region is that, in a region in the vicinity of the terminal region, due to generation of a pool of a photoresist liquid or the like, it is difficult to secure accuracy required for formation of the cell C by optical lithography, in a fabrication process. Moreover, in the present embodiment, the contact 32a is formed to have the large width W1 to aim for reduction of hole discharge resistance in a reverse recovery operation by making it easier to discharge holes accumulated in the terminal region from this contact 32a of the large width. When the width W2 of the contact 32b in the mesa portion having the source region 22 formed therein is widened, the distance between a channel of the MOSFET configured with the cell C and the contact region 28 becomes smaller to raise a threshold level of the MOSFET. Therefore, it is problematic to widen the width W2 of the contact 32b. On the contrary, since the mesa portion in the vicinity of the terminal region has no source regions 22 formed therein, it is possible to widen the width W1 of the contact 32a. Moreover, as described above, the photoresist becomes thicker in the vicinity of the terminal region due to the height difference of wirings and the like, and hence there is a problem of difficulty in accurate opening formation in optical lithography for formation of the contact 32a. However, there is an advantage of easy opening formation in the photoresist, because of the large width W1 of the contact 32a.

Subsequently, the operation principle of the semiconductor device 1 according to the present embodiment will be explained. For example, a predetermined positive voltage higher than the voltage of the source electrode 26 is applied to the drain electrode 10. In this state, when a voltage equal to or higher than the threshold level is applied to the gate electrode 18, the MOSFET formed in the cell C turns into an on-state. In this state, a channel is formed in the vicinity of the gate insulating film 20 in the base region 16. Thereafter, when the voltage of the gate insulating film 20 becomes lower than the threshold level, the MOSFET formed in the cell C turns into an off-state.

Figure 3:
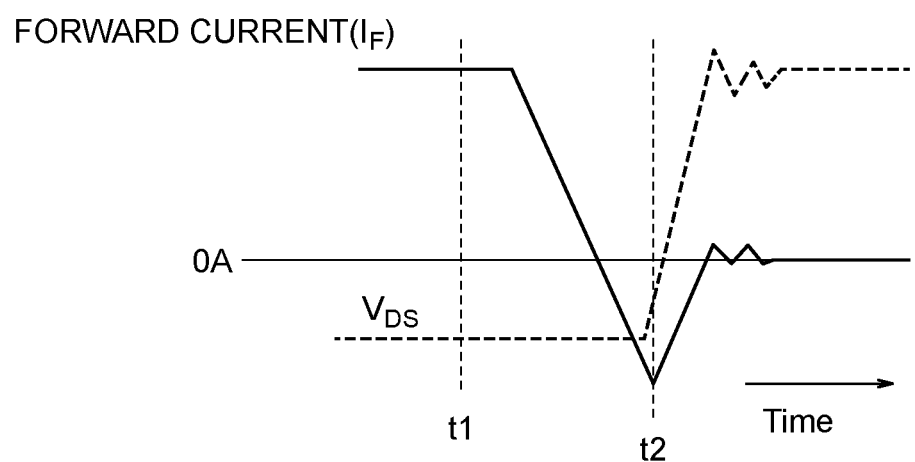
FIG. 3 is a graph representing a relationship between a body-diode current $I_F$ and time, and a relationship between a drain-to-source voltage $V_{DS}$ and time, in reverse recovery.

In reverse recovery in which a current, which is flowing through a body diode of the semiconductor device 1 in the forward direction, turns to flow in the reverse direction, a reverse current flows into the body diode instantaneously. FIG. 3 is an illustration that shows a graph which represents a relationship between a body-diode current $I_F$ and time, and a relationship between a drain-to-source voltage $V_{DS}$ and time, in reverse recovery. As shown in FIG. 3, in reverse recovery, although a current follows into the body diode in the reverse direction, the reverse current becomes zero when a time required for the reverse recovery has passed.

Figure 4:
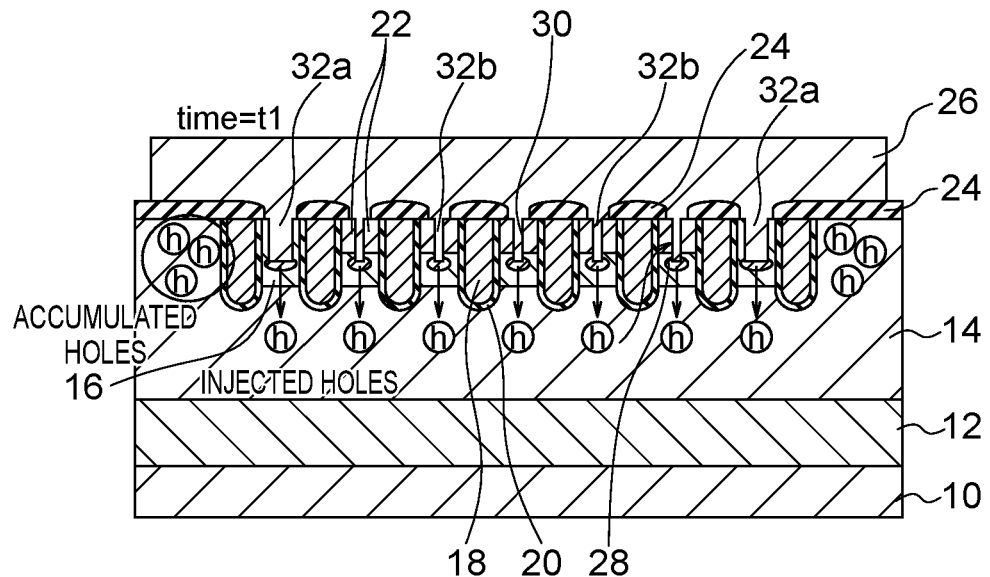
FIG. 4 is an illustration showing a state where a current flows into a body diode in a forward direction to inject holes into a drift region, at time t1 in FIG. 3.
Figure 5:
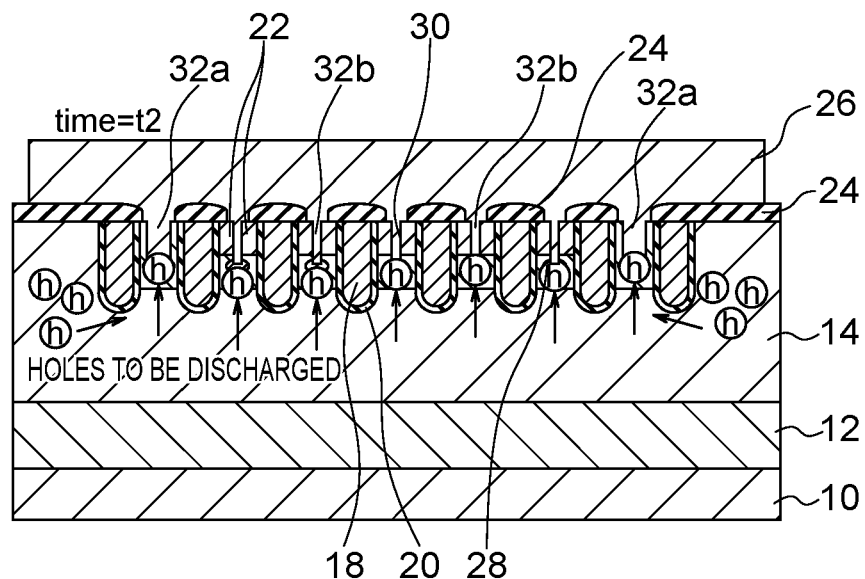
FIG. 5 is an illustration showing a state of hole discharging when a current flows into the body diode in a reverse direction, in reverse recovery at time t2 in FIG. 3.

In detail, at time t1, as shown in FIG. 4, a current flows into the body diode in the forward direction to inject holes into the drift region 14. Although the holes injected into the drift region 14 flows into the drain electrode 10, part of the holes is accumulated in the terminal regions of the semiconductor device 1. However, as shown in FIG. 5, although it is a very short time, a current flows into the body diode in the reverse direction at time t2 of the reverse recovery. In this reverse recovery, although the holes accumulated in the drift region 14 are discharged from the contacts 32, the holes accumulated in the terminal regions are far from the contacts 32a of the source electrode 26, and hence the discharge resistance becomes higher. For this reason, in the present embodiment, the width W1 of the contacts 32a in the vicinity of the terminal regions is made larger so that the holes are easily discharged from the contacts 32a of the source electrode 26, thereby reducing the discharge resistance. In this way, the damage of the gate insulating film 20, the thermal breakdown due to the generation of heat because of concentration of current, etc. are restricted.

Subsequently, an example of a fabrication process of the semiconductor device 1 according to the present embodiment will be explained based on FIGS. 6 to 16. FIGS. 6 to 16 are sectional views of the semiconductor device 1 in the orthogonal-to-trench direction, and they correspond to the above-described FIG. 1.

Figure 6:
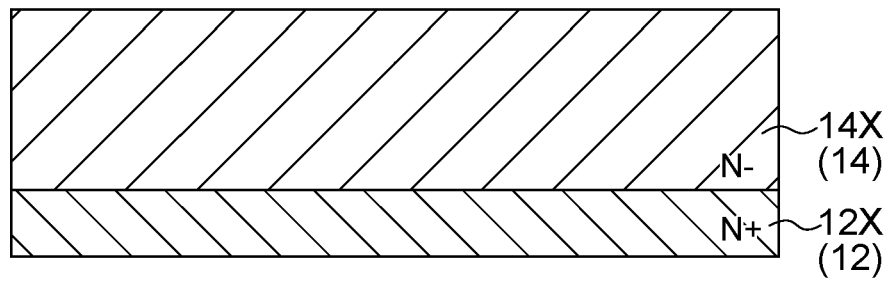
FIG. 6 is an illustration showing an example of a fabrication process of the semiconductor device according to the first embodiment.

First of all, as shown in FIG. 6, an n⁻-type semiconductor layer 14X is formed on an n⁺-type semiconductor substrate 12X. The semiconductor substrate 12X becomes the above-described drain region 12 and the semiconductor layer 14X becomes the above-described drift region 14.

Figure 7:
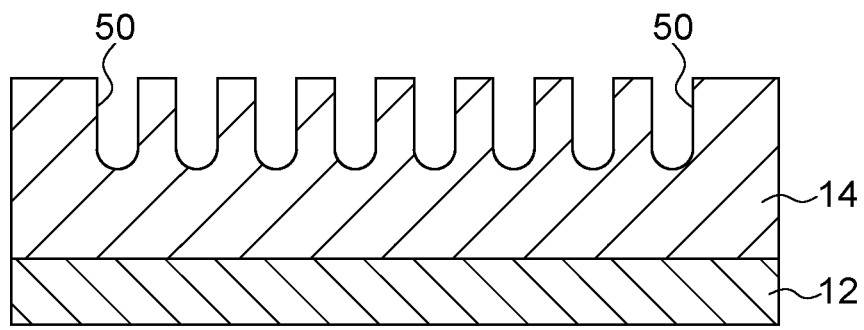
FIG. 7 is an illustration showing an example of the fabrication process of the semiconductor device according to the first embodiment.
Figure 8:
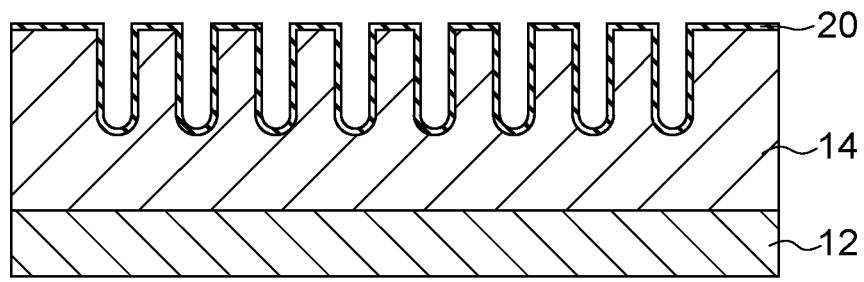
FIG. 8 is an illustration showing an example of the fabrication process of the semiconductor device according to the first embodiment.

Subsequently, as shown in FIG. 7, a plurality of trenches 50 are formed in the drift region 14. Succeedingly, as shown in FIG. 8, a gate insulating film 20 is formed on the surface of the drift region 14 including the trenches 50, for example, by thermal oxidation, CVD (Chemical Vapor Deposition), etc.

Figure 9:
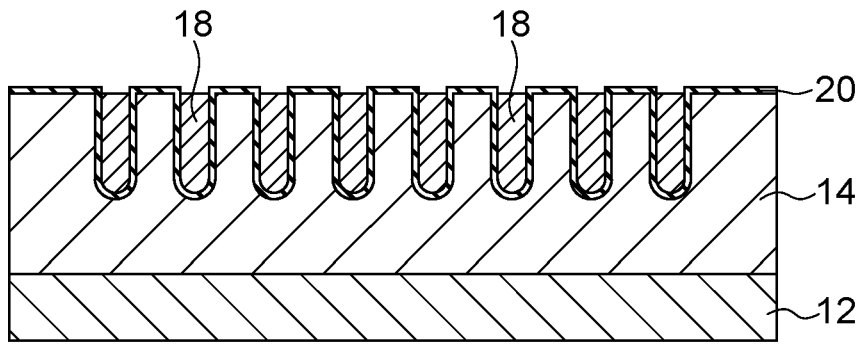
FIG. 9 is an illustration showing an example of the fabrication process of the semiconductor device according to the first embodiment.

Subsequently, as shown in FIG. 9, polysilicon is deposited on the gate insulating film 20, for example, by CVD and is etch-backed to form gate electrodes 18 with the polysilicon embedded in the trenches 50.

Figure 10:
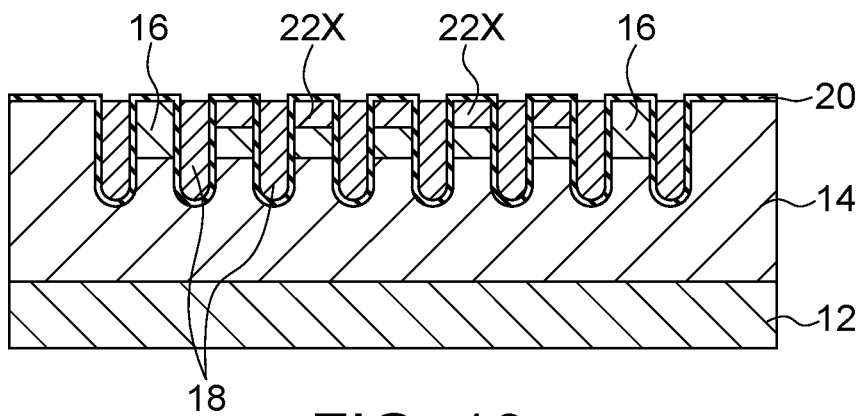
FIG. 10 is an illustration showing an example of the fabrication process of the semiconductor device according to the first embodiment.

Subsequently, as shown in FIG. 10, base regions 16 are formed in the drift region 14, for example, by ion implantation of boron (B) to the drift region 14. The formation of the base regions 16 by the boron ion implantation is performed to both of the mesa portions where the cells C are to be formed and the mesa portions, in the vicinity of the terminal regions, where the cells C are not to be formed. Succeedingly, for example, ion implantation of phosphorus (P) or arsenic (As) is performed above the base regions 16 to form n⁺-type semiconductor regions 22X. The formation of the semiconductor regions 22X is performed to the mesa portions in which the cells C are to be formed. In other words, the semiconductor regions 22X are not formed in the mesa portions, in the vicinity of the terminal regions, in which the cells C are not to be formed.

Figure 11:
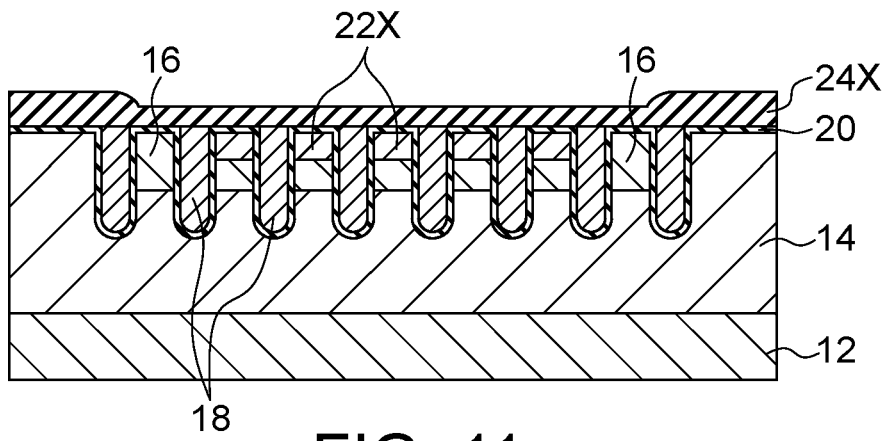
FIG. 11 is an illustration showing an example of the fabrication process of the semiconductor device according to the first embodiment.
Figure 12:
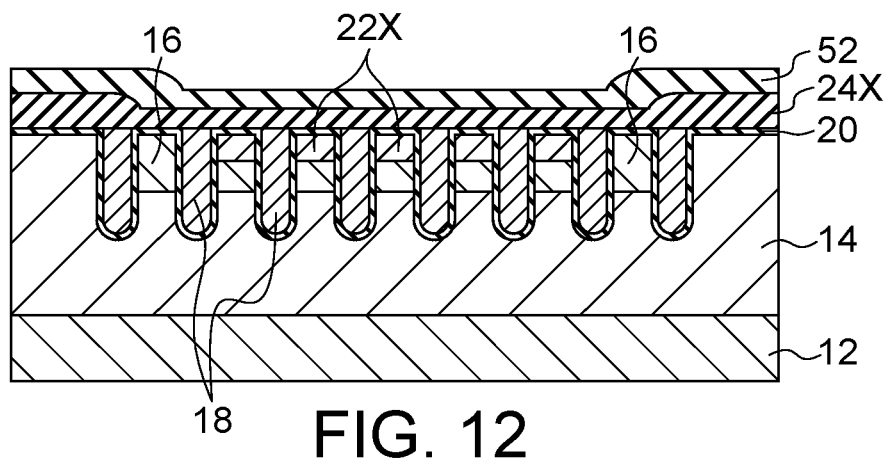
FIG. 12 is an illustration showing an example of the fabrication process of the semiconductor device according to the first embodiment.

Subsequently, as shown in FIG. 11, an insulating film 24X is formed on the entire surface of the semiconductor device by CVD, for example. Succeedingly, as shown in FIG. 12, photoresist 52 is formed on the insulating film 24X. The photoresist 52 is formed by, for example, applying a photoresist liquid by spin coating. However, in this case, a pool of liquid inevitably tends to be generated in the vicinity of the terminal regions, so that variation in film thickness tends to occur on the photoresist 52.

Figure 13:
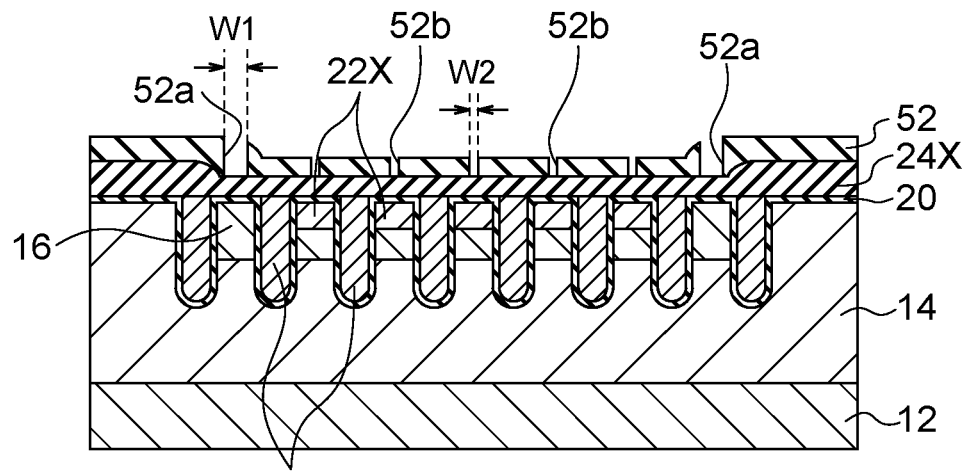
FIG. 13 is an illustration showing an example of the fabrication process of the semiconductor device according to the first embodiment.

Subsequently, as shown in FIG. 13, the photoresist 52 is patterned by optical lithography to have openings 52a and 52b. The openings 52a and 52b are formed at the locations where contacts 32 of the source electrode 26 are to be formed. It is difficult for the openings 52a to secure accuracy because the openings 52a are formed in the vicinity of terminal regions having variation in film thickness of the photoresist 52. For this reason, although contact failure or the like tends to occur, in the present embodiment, the width W1 of the contacts 32a in the mesa portions in the vicinity of the terminal regions is larger than the width W2 of the contacts 32b in the mesa portions where the cells C are present.

Therefore, the width of the openings 52a in the mesa portions in the vicinity of the terminal regions can be made larger than the width of the openings 52b in the mesa portions where the cells C are to be formed. In the present embodiment, the openings 52a are also formed with the larger width W1 whereas the openings 52b are also formed with the smaller width W2. In this way, the probability of occurrence of contact failure is reduced in the contacts 32a formed in the mesa portions in the vicinity of the terminal regions.

Figure 14:
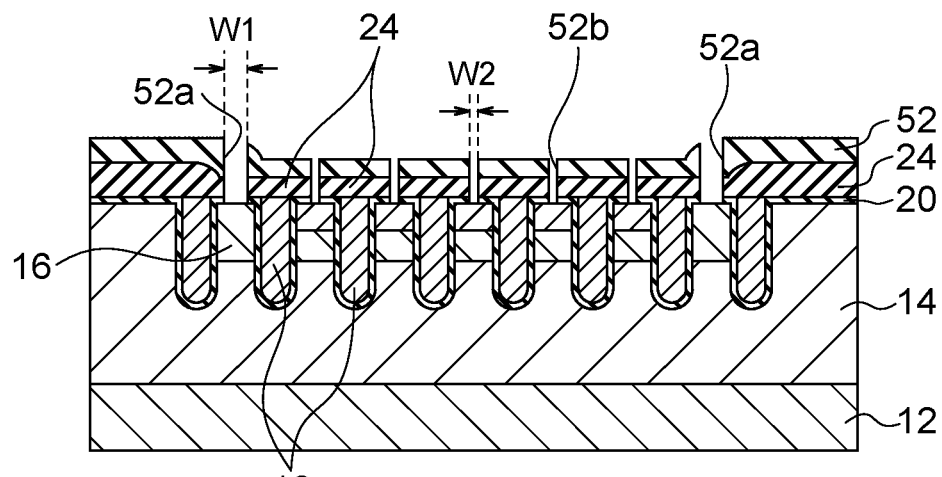
FIG. 14 is an illustration showing an example of the fabrication process of the semiconductor device according to the first embodiment.
Figure 15:
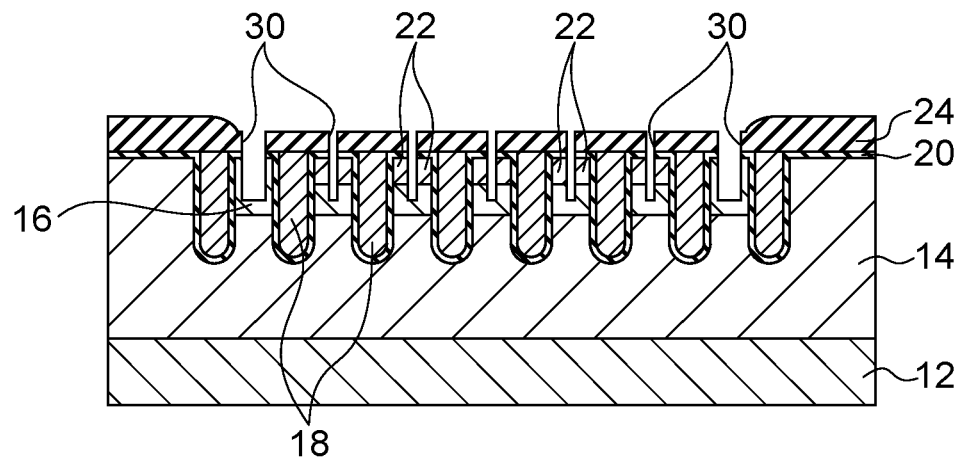
FIG. 15 is an illustration showing an example of the fabrication process of the semiconductor device according to the first embodiment.

Subsequently, as shown in FIG. 14, the insulating film 24X is etched by, for example, RIE, to be patterned to form insulating regions 24. Succeedingly, as shown in FIG. 15, the semiconductor regions 22X and the base regions 16 are etched by, for example, RIE, to form trenches 30 which penetrate through the insulating regions 24 and the semiconductor regions 22X to reach the base regions 16, respectively. The source regions 22 are formed with the etched semiconductor regions 22X. Then, the photoresist 52 is removed.

Figure 16:
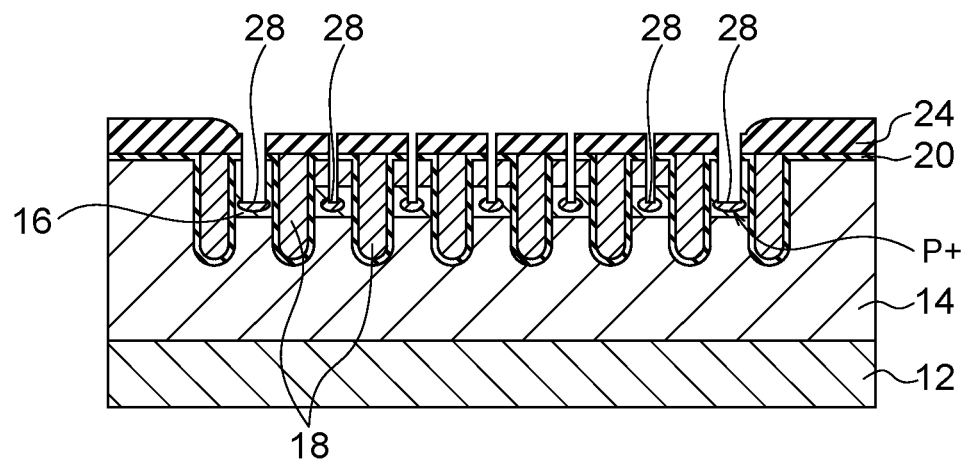
FIG. 16 is an illustration showing an example of the fabrication process of the semiconductor device according to the first embodiment.

Subsequently, as shown in FIG. 16, ion implantation of, for example, boron (B), is performed through the trenches 30 to the base region 16 in order to form contact regions 28 in the base regions 16 which are exposed in the bottom of the trenches 30, respectively.

Subsequently, as shown in FIGS. 1 and 2, the source electrode 26 is formed on the insulating regions 24 to fill the trenches 30, followed by the drain electrode 10 formed under the drain region 12. Specifically, for example, a front surface metal is formed and processed to form a passivation film, followed by wafer thinning to form the source electrode 26, with the drain electrode 10 being formed by formation of a rear surface metal, thereby the semiconductor device 1 shown in FIGS. 1 and 2 being obtained.

The drain region 12 and/or the drift region 14 according to the present embodiment correspond(s) to a first semiconductor region. The mesa portion where the source region 22 is formed, according to the present embodiment, corresponds to a first region. The mesa portion where the source region 22 is not formed, according to the present embodiment, corresponds to a second region. The contact 32b according to the present embodiment corresponds to a first contact. The contact 32a according to the present embodiment corresponds to a second contact. Moreover, the width W2 of the contact 32b corresponds to a first width and the width W1 of the contact 32a corresponds to a second width.

As described above, in the semiconductor device 1 according to the present embodiment, the width W1 of the contact 32a of the source electrode 26 in the mesa portion having no cells C formed therein, in the vicinity of each terminal region, is larger than the width W2 of the contact 32b of the source electrode 26 in the mesa portion where the cell C is formed. Therefore, breakdown rarely occurs on the gate insulating film 20, which otherwise occurs due to the voltage increase in MOSFET's reverse recovery. Moreover, in the MOSFET's reverse recovery, although there is current concentration on the contacts 32a in the vicinity of the terminal regions, the width W1 of the contacts 32a is increased and hence it can be achieved to restrict the generation of heat to protect the semiconductor device 1 from being damaged.

Second Embodiment

A second embodiment is to aim for reduction of charge resistance of holes from a terminal part in reverse recovery, by widening also the contacts 32 present in the regions where source regions 22 of the cells C are not formed, in the terminal part in the trench longitudinal direction, in the semiconductor device 1 according to the above-described first embodiment. Hereinbelow, the portion of the second embodiment different from the above-described first embodiment will be explained.

Figure 17:
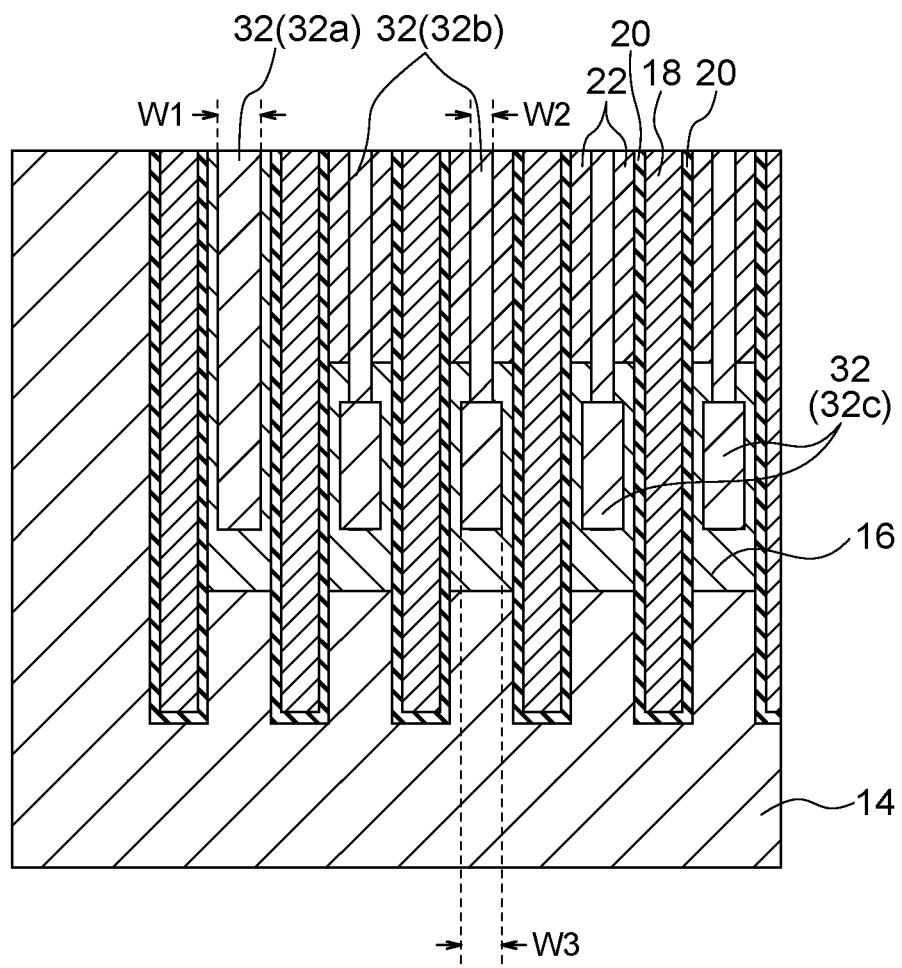
FIG. 17 is a sectional view of a semiconductor device according to a second embodiment in a front surface direction.

FIG. 17 is a sectional view of a semiconductor device 1 according to the present embodiment in the front surface direction, corresponding to FIG. 2 of the above-described first embodiment. As shown in FIG. 17, in the semiconductor device 1 according to the present embodiment, no source regions 22 are formed in the terminal part in the trench longitudinal direction, that is, in the terminal part in a direction in which the contacts 32 extend. This is because, as described above, it is difficult to secure accuracy in optical lithography. For this reason, in the semiconductor device 1 according to the present embodiment, the contacts 32 present in the terminal part in the trench longitudinal direction have a larger width W3 than the above-described width W2. In the following, the portion of each contact 32 having the width W3 is referred as a contact 32c. The contact 32c is made of a metal integrally with the source electrode 26. In other words, the contact 32c is electrically connected to each contact 32b and also electrically connected to the source electrode 26.

The width W3 of the contact 32c may be the same as or different from the width W1 of each contact 32a. The contact 32c may also be formed in a terminal part (not shown) present in the opposite side of the contact 32b.

Due to the presence of the contacts 32c, in reverse recovery, holes can be discharged, not only from the contacts 32a of the source electrode 26, but also from the contacts 32c. Therefore, the holes accumulated in the drift region 14 can be more easily discharged to reduce hole discharge resistance. Accordingly, the breakdown of the gate insulating films 20 rarely occurs, which otherwise occur due to the voltage increase in MOSFET's reverse recovery.

Each contact 32c according to the present embodiment corresponds to a third contact. The width W3 of the contact 32c according to the present embodiment corresponds to a third width.

Third Embodiment

A third embodiment is to form the contacts 32, not with the metal that is part of the source electrode 26, but with a p$^+$-type semiconductor region, in the above-described first embodiment. Hereinbelow, the portion of the third embodiment different from the above-described first embodiment will be explained.

Figure 18:
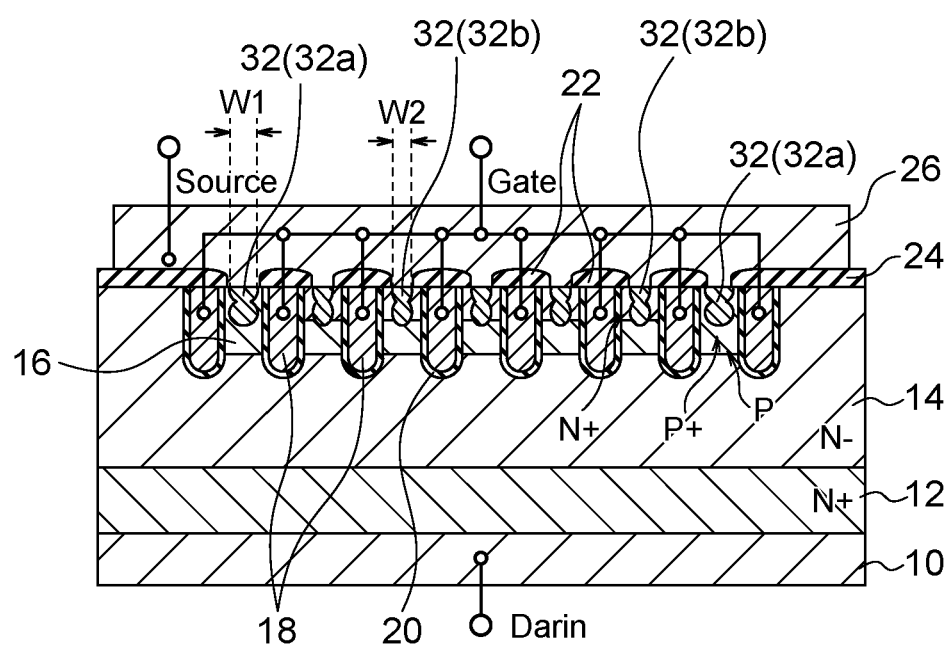
FIG. 18 is a sectional view of a semiconductor device according to a third embodiment in an orthogonal-to-trench direction.

FIG. 18 is a sectional view of a semiconductor device 1 according to the present embodiment in the orthogonal-to-trench direction, corresponding to FIG. 1 of the above-described first embodiment. As shown in FIG. 18, in the present embodiment, the contacts 32 which electrically connect the source electrode 26 and the base regions 16 are formed with a p$^+$-type semiconductor region. In detail, in the above-described first embodiment, the contacts 32 are formed with the metal that forms the source electrode 26, whereas, in the present embodiment, the contacts 32 are formed with a p$^+$-type semiconductor region formed by, for example, multistage ion implantation to the base regions 16.

Also, in the present embodiment, the width W1 of the contacts 32 formed in the mesa portions where no source regions 22 are formed, in the vicinity of the terminal regions, is larger than the width W2 of the contacts 32 formed in the mesa portions where the source regions 22 are present. Therefore, hole discharge resistance can be reduced in the same manner as the above-described first embodiment. Although, in the present embodiment, no contact regions 28 are formed in the base regions 16, a p$^{++}$-type contact region 28 can be formed in the base region 16 located at the lower side of each contact 32. Subsequently, a fabrication process of the semiconductor device 1 according to the present embodiment will be explained.

Figure 19:
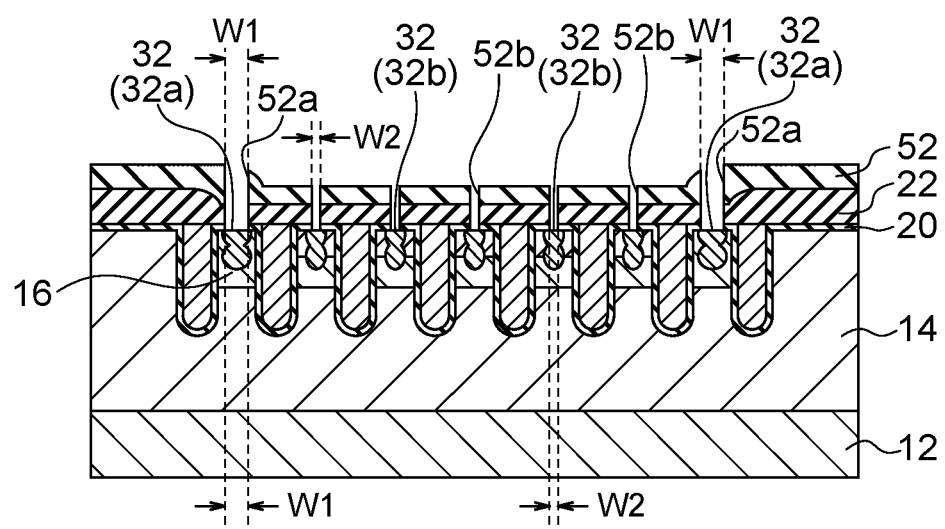
FIG. 19 is an illustration showing an example of a fabrication process of the semiconductor device according to the third embodiment.

The fabrication process of the semiconductor device 1 according to the present embodiment is the same as that of the semiconductor device 1 according to the first embodiment, up to the step shown in FIG. 14. After the step of FIG. 14, as shown in FIG. 19, contacts 32 are formed by multistage ion implantation of boron (B) or the like to the base regions 16. In other words, the ion implantation depth is varied according to need to perform ion implantation, a plurality of times, to the base regions 16.

In this step, the width W1 of openings 52$a$ formed in the photoresist 52 is made larger than the width W2 of openings 52$b$ also formed in the photoresist 52. Therefore, in the mesa portions in the vicinity of the terminal regions, the contacts 32$a$ are formed to have a larger width W1, whereas, in the mesa portions to configure cells C, having source regions 22 formed therein, the contacts 32$b$ are formed to have a smaller width W2. Then, the photoresist 52 is removed. Thereafter, in the same manner as the above-described first embodiment, a source electrode 26 is formed on the front surface of the semiconductor device 1 and a drain electrode 10 is formed on the rear surface of the semiconductor device 1, to obtain a semiconductor device 1 shown in FIG. 18.

As described above, also in the semiconductor device 1 according to the present embodiment, the width W1 of the contacts 32$a$ of the source electrode 26 in the mesa portions where no cells C are formed, in the vicinity of the terminal regions, is larger than the width W2 of the contacts 32$b$ in the mesa portions where the cells C are formed. Therefore, brake down rarely occurs on the gate insulating films 20, which otherwise occurs due to voltage increase in MOSFET's reverse recovery. Moreover, in the MOSFET's reverse recovery, although there is current concentration on the contacts 32$a$ present in the vicinity of the terminal regions, because of the larger width of the contacts 32$a$, it can be achieved to restrict the generation of heat to protect the semiconductor device 1 from being damaged.

The contacts 32$a$ and 32$b$ according to the present embodiment correspond to a second semiconductor region.

Fourth Embodiment

A fourth embodiment, which is a modified version of the above-described first embodiment, has a trench field-plate structure formed with an embedded electrode under each gate electrode 18. Hereinbelow, the portion of the fourth embodiment different from the above-described first embodiment will be explained.

Figure 20:
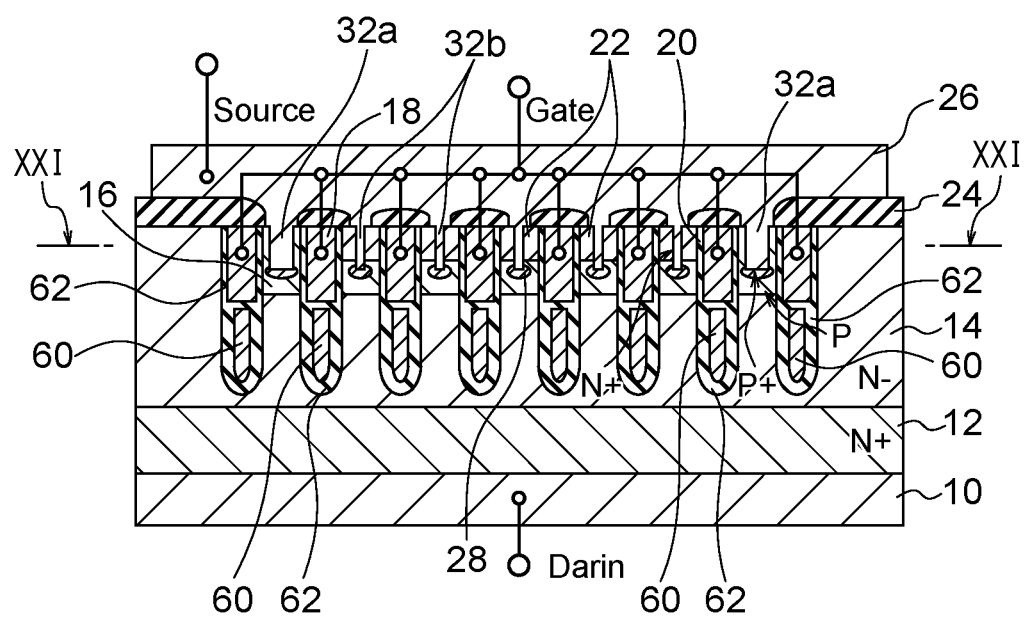
FIG. 20 is a sectional view of a semiconductor device according to a fourth embodiment in an orthogonal-to-trench direction.
Figure 21:
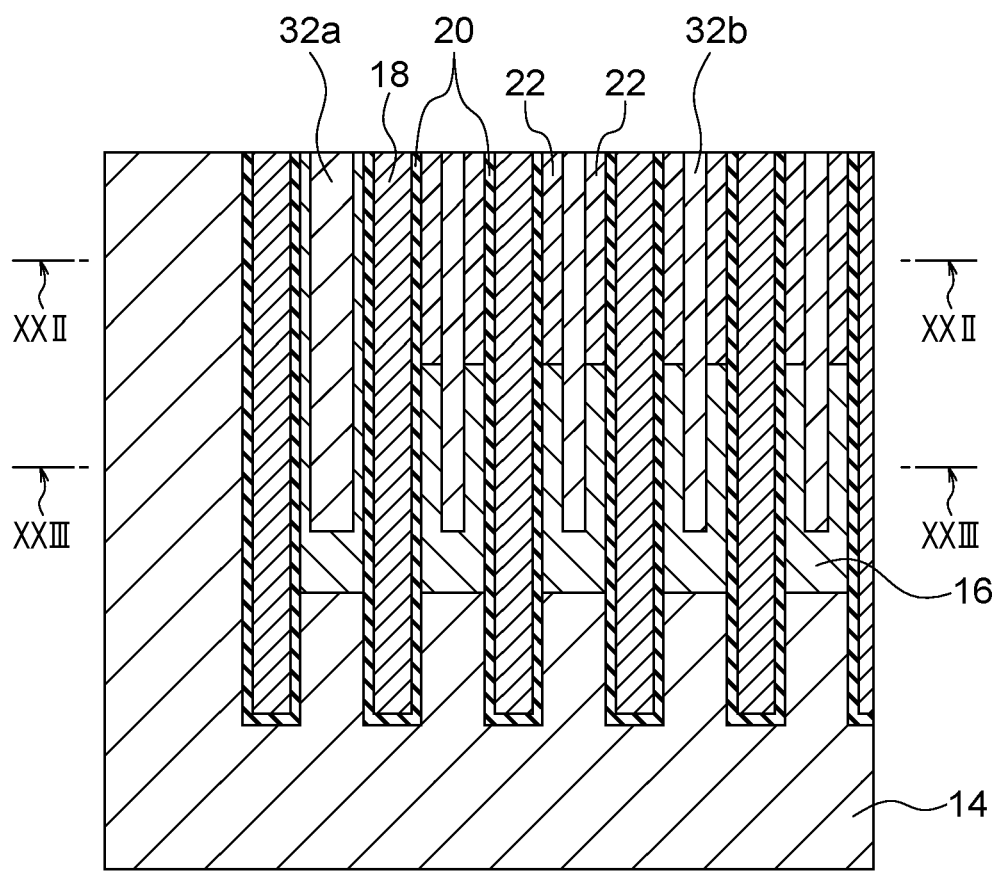
FIG. 21 is a sectional view taken on line XXI-XXI in FIG. 20 of the semiconductor device according to the fourth embodiment.
Figure 22:
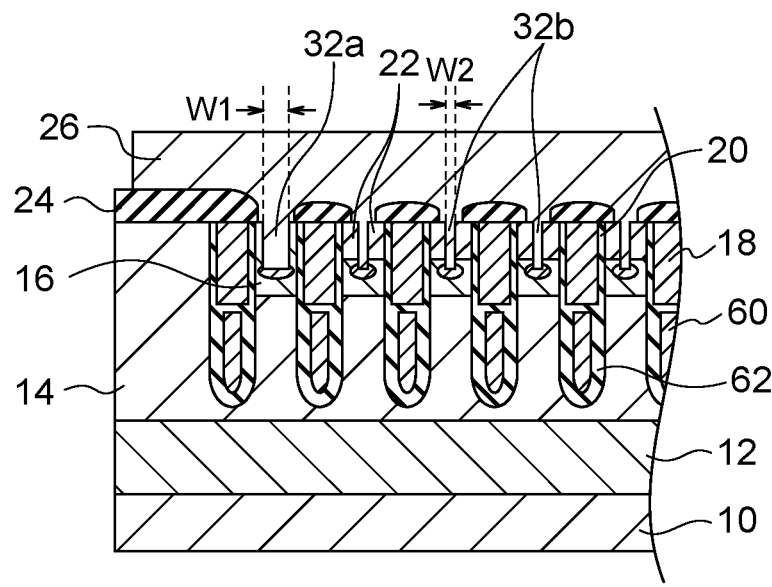
FIG. 22 is a sectional view taken on line XXII-XXII in FIG. 21 of the semiconductor device according to the fourth embodiment.
Figure 23:
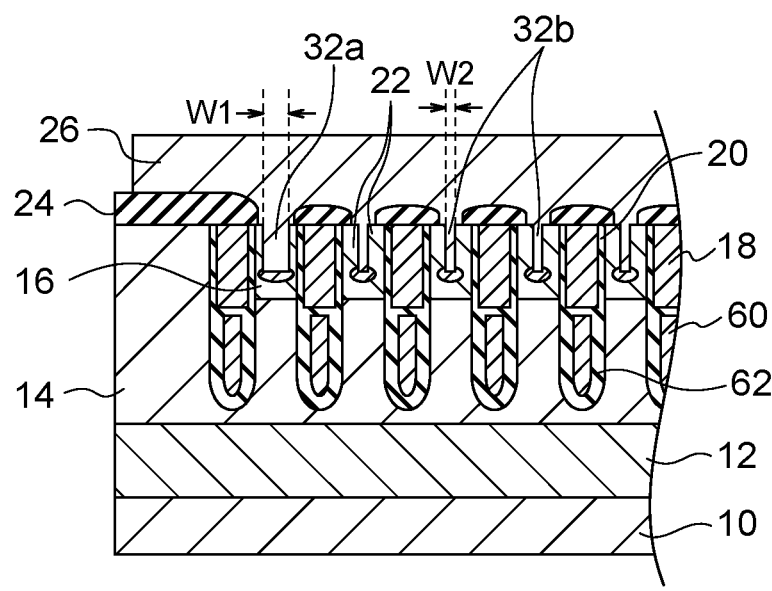
FIG. 23 is a sectional view taken on line XXIII-XXIII in FIG. 21 of the semiconductor device according to the fourth embodiment.

FIG. 20 is a sectional view of a semiconductor device 1 according to the present embodiment in the orthogonal-to-trench direction, corresponding to FIG. 1 of the above-described first embodiment. FIG. 21 is a sectional view taken on line XXI-XXI in FIG. 20 of the semiconductor device 1, corresponding to FIG. 2 of the above-described first embodiment. FIG. 22 is a sectional view taken on line XXII-XXII in FIG. 21 of the semiconductor device 1. FIG. 23 is a sectional view taken on line XXIII-XXIII in FIG. 21 of the semiconductor device 1.

As shown in these FIGS. 20 to 23, the semiconductor device 1 according to the present embodiment has a field plate electrode 60 embedded in the drift region 14 under each gate electrode 18. In detail, the field plate electrode 60 is embedded in the drift region 14 via a field-plate insulating film 62. Although the field-plate insulating film 62 is formed to surround the field plate electrode 60, the field plate electrode 60 is electrically connected to the gate electrode 18 or the source electrode 26. The field-plate insulating film 62 is formed thicker than the gate insulating film 20.

Although, a MOSFET structure having the field plate electrode 60 present therein is referred to as a trench field-plate structure, it is also referred to as a split gate structure, a shield gate structure, etc. in other terms. Having the presence of the field plate electrode 60, positive charges of ionized donors in the drift region 14 can be cancelled, so that space charges in the drift region 14 seem to be practically zero to give a near flat electric-field profile to raise the breakdown voltage of the semiconductor device 1. Moreover, the impurity concentration of the drift region 14 can be raised in inverse proportion to the width between the gate electrodes 18, that is, the width of each mesa portion. Therefore, the resistance of the drift region 14 can be reduced by pitch shrink of the cells C to raise the impurity concentration.

As shown in FIGS. 21 and 23, no source regions 22 are formed in the terminal part of the contacts 32 of the source electrode 26 in the trench longitudinal direction. This is because, due to a thick insulating film formed with the field-plate insulating film 62 and with the gate insulating film 20, a pool of liquid is generated when a photoresist is formed, so that openings cannot be formed accurately and hence a MOSFET cannot be formed at a high accurately.

Subsequently, a fabrication process of the semiconductor device 1 according to the present embodiment will be explained based on FIGS. 24 to 37. FIGS. 24 to 37 are sectional views of the semiconductor device 1 in the orthogonal-to-trench direction, corresponding to the above-described FIG. 20.

Figure 24:
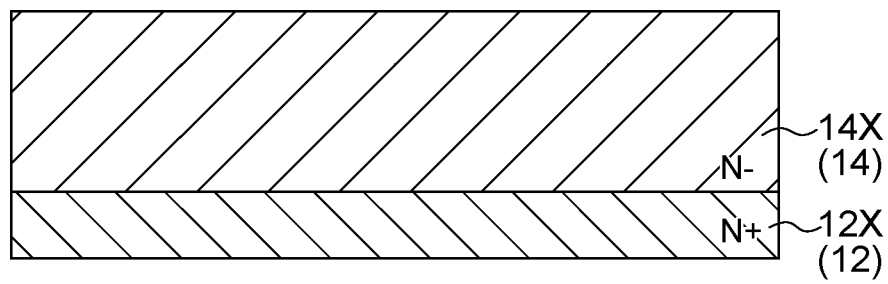
FIG. 24 is an illustration showing an example of a fabrication process of the semiconductor device according to the fourth embodiment.

First of all, as shown in FIG. 24, an n$^-$-type semiconductor layer 14X is formed on an n$^+$-type semiconductor substrate 12X. The semiconductor substrate 12X becomes the above-described drain region 12 and the semiconductor layer 14X becomes the above-described drift region 14.

Figure 25:
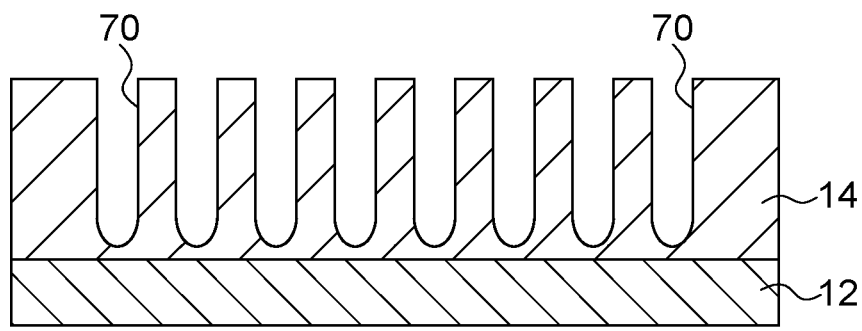
FIG. 25 is an illustration showing an example of the fabrication process of the semiconductor device according to the fourth embodiment.
Figure 26:
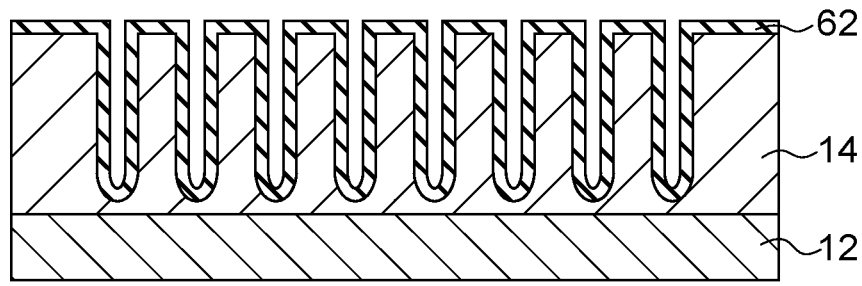
FIG. 26 is an illustration showing an example of the fabrication process of the semiconductor device according to the fourth embodiment.

Subsequently, as shown in FIG. 25, a plurality of trenches 70 are formed in the drift region 14. The trenches 70 are formed deeper than the trenches 50 in the first embodiment, because of the formation of field plate electrodes 60 in a later step. Succeedingly, as shown in FIG. 26, the field-plate insulating film 62 is formed on the surface of the drift region 14 including the trenches 70, for example, by thermal oxidation or CVD. As described above, the field-plate insulating film 62 has a larger film thickness than the gate electrodes 18.

Figure 27:
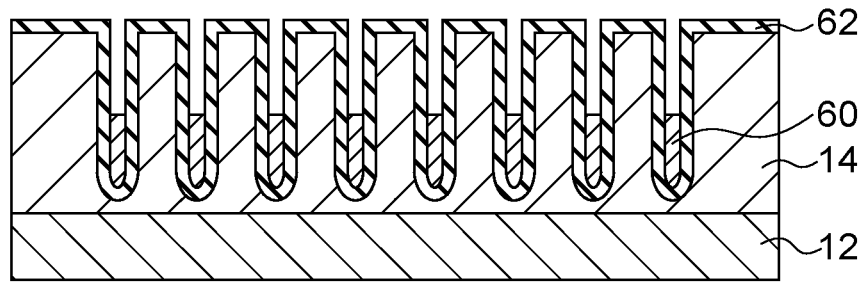
FIG. 27 is an illustration showing an example of the fabrication process of the semiconductor device according to the fourth embodiment.

Subsequently, as shown in FIG. 27, polysilicon is deposited on the field-plate insulating film 62, for example, by CVD, followed by etch back, to form the field plate electrodes 60 with the polysilicon embedded in the trenches 70.

Figure 28:
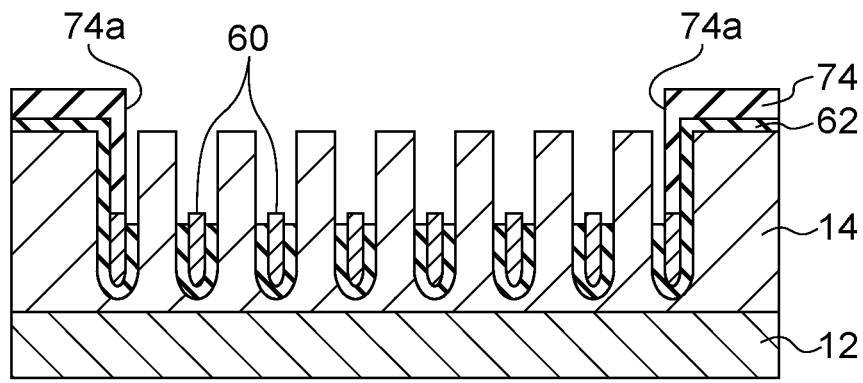
FIG. 28 is an illustration showing an example of the fabrication process of the semiconductor device according to the fourth embodiment.

Subsequently, as shown in FIG. 28, a photoresist 74 is formed by patterning with optical lithography. The photoresist 74 has openings 74a in mesa portions where source regions 22 are to be formed. The field-plate insulating film 62 at a terminal region side of mesa portions located closest to the terminal regions, where no source regions 22 are formed, is covered with the photoresist 74. Thereafter, the field-plate insulating film 62 exposed through the openings 74a is removed, for example, by wet etching. Therefore, the field-plate insulating film 62, formed on the side wall at a terminal region side of the trenches 70 located in the terminal regions, remains without being etched away, because of being covered with the photoresist 74.

Figure 29:
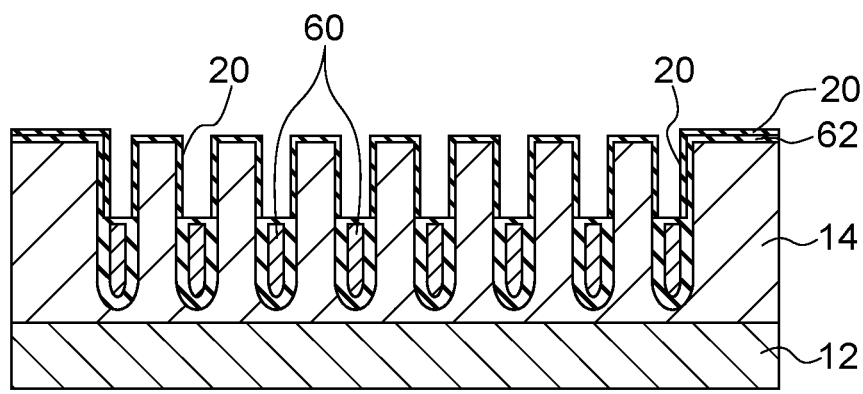
FIG. 29 is an illustration showing an example of the fabrication process of the semiconductor device according to the fourth embodiment.
Figure 30:
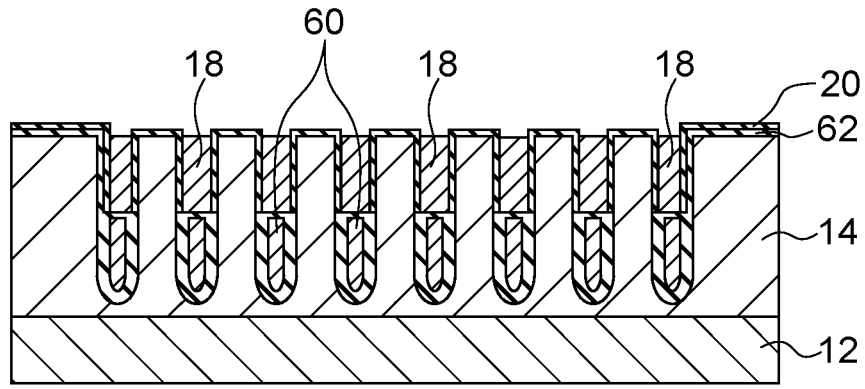
FIG. 30 is an illustration showing an example of the fabrication process of the semiconductor device according to the fourth embodiment.

Subsequently, as shown in FIG. 29, the photoresist 74 is removed and then a gate insulating film 20 is formed on the entire surface of the semiconductor device, for example, by thermal oxidation or CVD. In other words, the gate insulating film 20 is formed inside the trenches 70 and on the field plate electrodes 60. In this step, since the field-plate insulating film 62 remains in the terminal regions, the gate insulating film 20 is formed on this field-plate insulating film 62. Therefore, the insulating films in the terminal regions are thicker than the insulating films in the regions where cells C are to be formed. The thickness of the insulating film on the side wall of each trench 70 at a terminal side in the terminal region is the total thickness of the remaining field-plate insulating film 62 and gate insulating film 20. According to need of film thickness adjustments or the like, a step of selectively forming an insulating film on the field plate electrode 60 may be performed. Subsequently, as shown in FIG. 30, polysilicon is formed, for example, by CVD and etched-back to fill the space where the trenches 70 remain, to form a gate insulating film 20.

Figure 31:
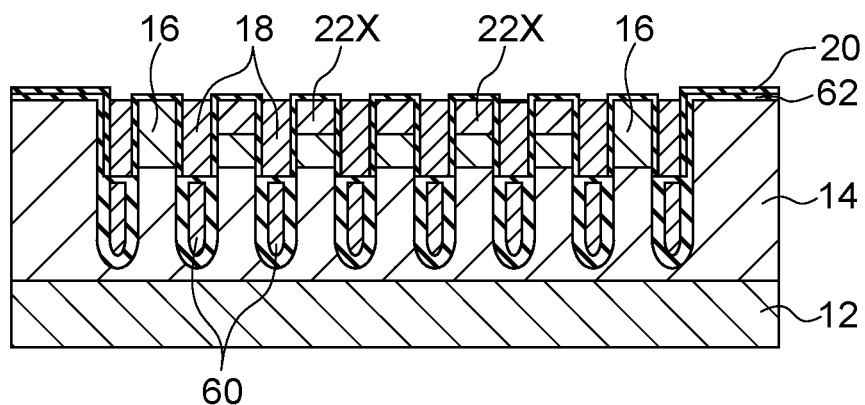
FIG. 31 is an illustration showing an example of the fabrication process of the semiconductor device according to the fourth embodiment.

Subsequently, as shown in FIG. 31, base regions 16 are formed in the drift region 14, for example, by ion implantation of boron (B) to the drift region 14. The formation of the base regions 16 by the boron ion implantation is performed to both of the mesa portions where the cells C are to be formed and the mesa portions, in the vicinity of the terminal regions, where the cells C are not to be formed. Succeedingly, for example, ion implantation of phosphorus (P) or arsenic (As) is performed above the base regions 16 to form $n^+$-type semiconductor regions 22X. The formation of the semiconductor regions 22X is performed to the mesa portions where the cells C are to be formed. In other words, the semiconductor regions 22X are not formed in the mesa portions, in the vicinity of the terminal regions, where the cells C are not to be formed.

Figure 32:
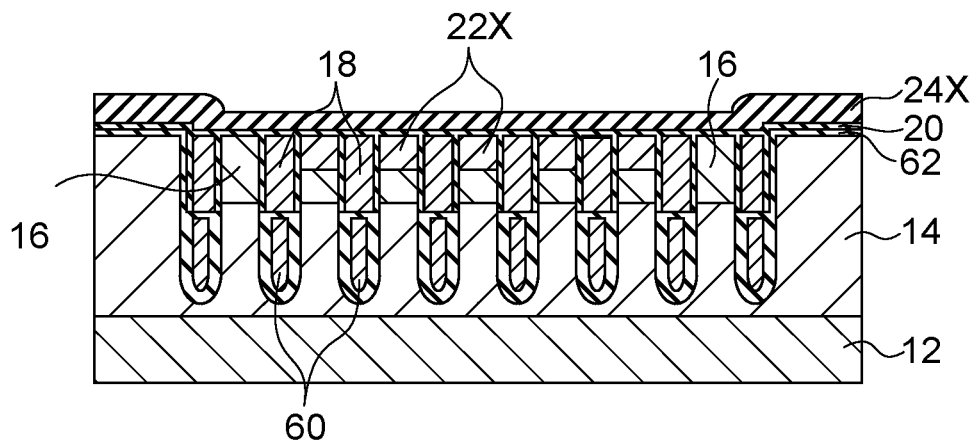
FIG. 32 is an illustration showing an example of the fabrication process of the semiconductor device according to the fourth embodiment.

Subsequently, as shown in FIG. 32, an insulating film 24X is formed on the entire surface of the semiconductor device by CVD, for example. In this case, there is a step between an insulating film formed with the gate insulating film 20 and the field-plate insulating film 62, and the gate insulating film 20, in the vicinity of the terminal regions. Therefore, the insulating film 24X is also formed with a step.

Figure 33:
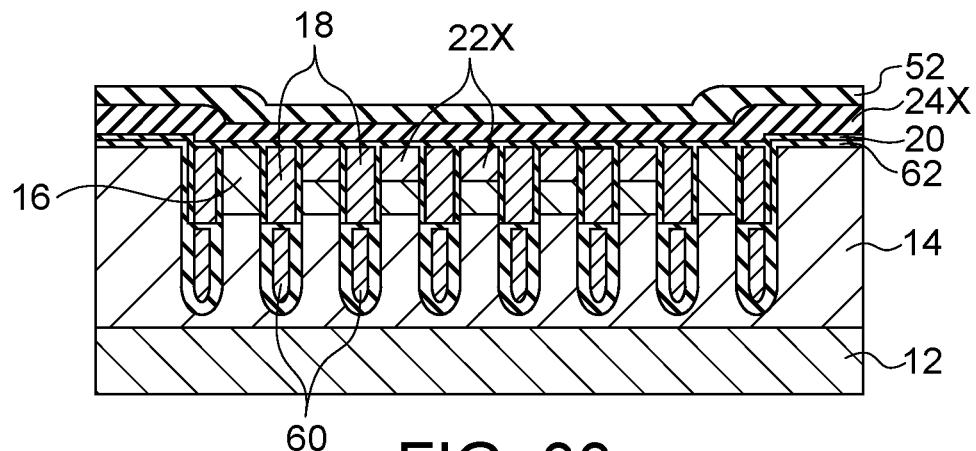
FIG. 33 is an illustration showing an example of the fabrication process of the semiconductor device according to the fourth embodiment.

Succeedingly, as shown in FIG. 33, photoresist 52 is formed on the insulating film 24X. The photoresist 52 is formed by, for example, applying a photoresist liquid by spin coating. However, in this case, a pool of liquid inevitably tends to be generated in the vicinity of the terminal regions, so that variation in film thickness tends to occur on the photoresist 52.

Figure 34:
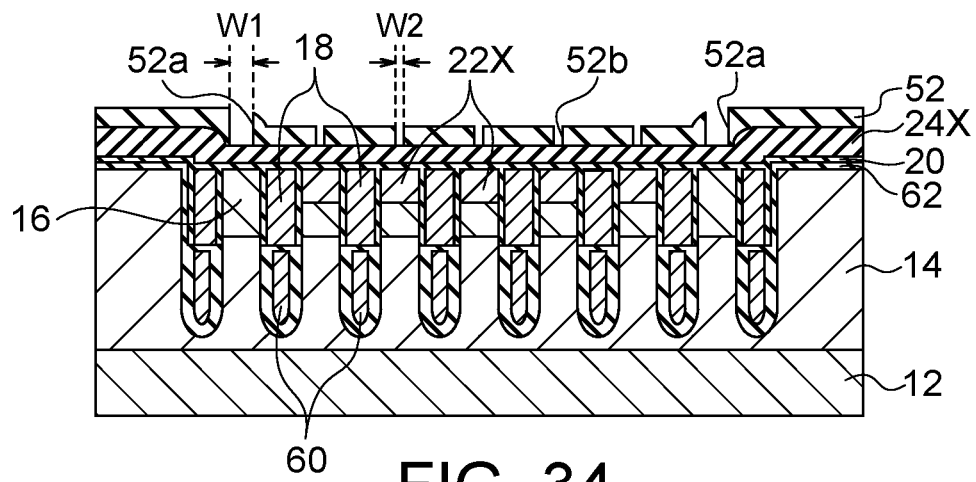
FIG. 34 is an illustration showing an example of the fabrication process of the semiconductor device according to the fourth embodiment.

Subsequently, as shown in FIG. 34, the photoresist 52 is patterned by optical lithography to have openings 52a and 52b. The openings 52a and 52b are formed at the locations where contacts 32 of the source electrode 26 are to be formed. It is difficult for the openings 52a to secure accuracy because the openings 52a are formed in the vicinity of terminal regions having variety in film thickness of the photoresist 52. For this reason, although contact failure or the like tends to occur, in the present embodiment, the width W1 of the contacts 32a in the mesa portions in the vicinity of the terminal regions is larger than the width W2 of the contacts 32b in the mesa portions where the cells C are present.

Therefore, the width of the openings 52a in the mesa portions in the vicinity of the terminal regions can be made larger than the width of the openings 52b in the mesa portions where the cells C are to be formed. In the present embodiment, the openings 52a are also formed with the larger width W1 whereas the openings 52b are also formed with the smaller width W2. In this way, the probability of occurrence of contact failure is reduced in the contacts 32a formed in the mesa portions in the vicinity of the terminal regions.

Figure 35:
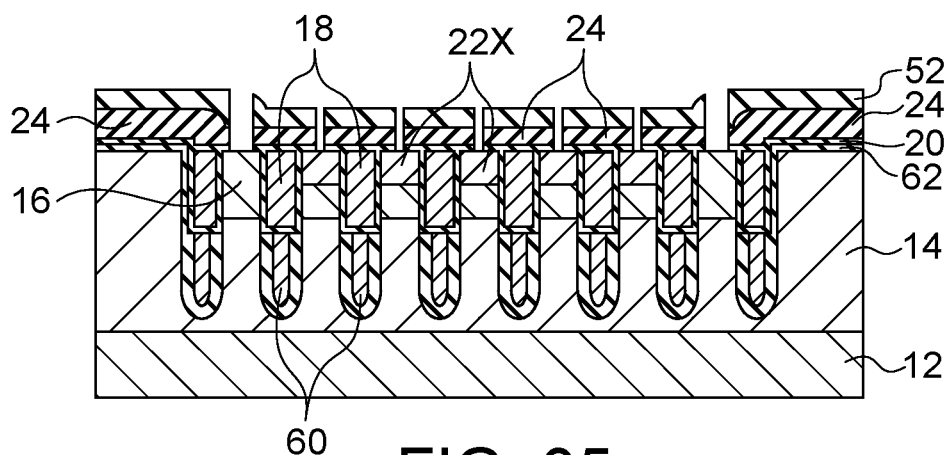
FIG. 35 is an illustration showing an example of the fabrication process of the semiconductor device according to the fourth embodiment.
Figure 36:
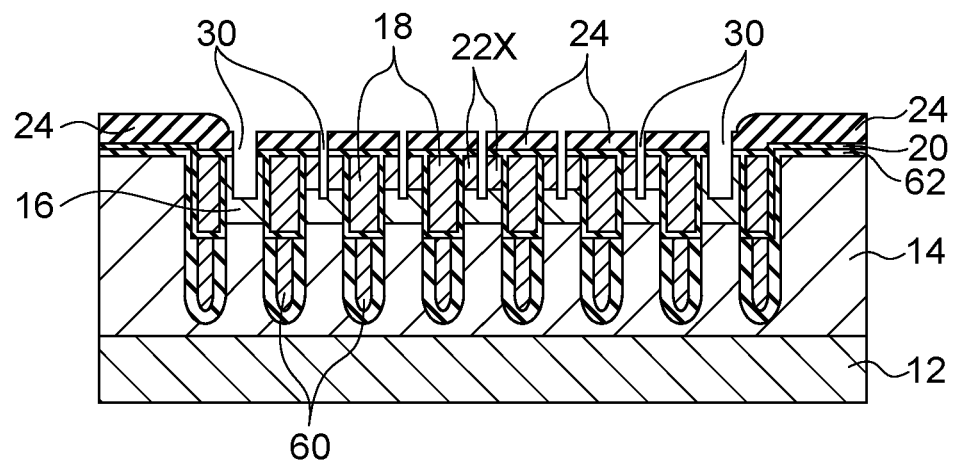
FIG. 36 is an illustration showing an example of the fabrication process of the semiconductor device according to the fourth embodiment.

Subsequently, as shown in FIG. 35, the insulating film 24X is etched by, for example, RIE, to be patterned to form insulating regions 24. Succeedingly, as shown in FIG. 36, the semiconductor regions 22X and the base regions 16 are etched by, for example, RIE, to form trenches 30 which penetrate through the insulating regions 24 and the semiconductor regions 22X to reach the base regions 16, respectively. The source regions 22 are formed with the etched semiconductor regions 22X. Then, the photoresist 52 is removed.

Figure 37:
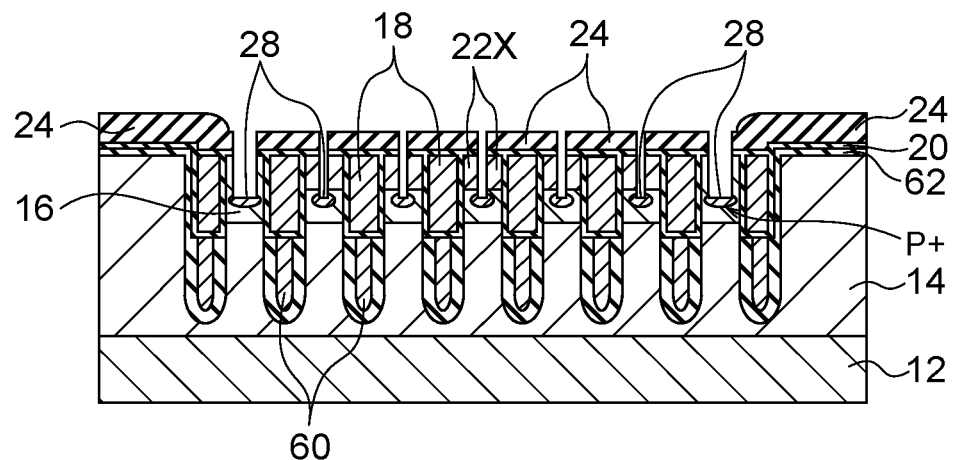
FIG. 37 is an illustration showing an example of the fabrication process of the semiconductor device according to the fourth embodiment.

Subsequently, as shown in FIG. 37, through the trenches 30, ion implantation of, for example, boron (B), is performed to the base regions 16 to form contact regions 28 in the base regions 16 which are exposed in the bottom of the trenches 30, respectively. Thereafter, in the same manner as the above-described first embodiment, a source electrode 26 is formed on the front surface of the semiconductor device 1 and a drain electrode 10 is formed on the rear surface of the semiconductor device 1, to obtain the semiconductor device 1 shown in FIG. 20.

As described above, also in the semiconductor device 1 according to the present embodiment, the width W1 of the contacts 32a of the source electrode 26 in the mesa portions where no source regions 22 are formed, in the vicinity of the terminal regions, is larger than the width W2 of the contacts 32b in the mesa portions where the source regions 22 are formed. Therefore, brake down rarely occurs on the gate insulating films 20, which otherwise occurs due to voltage increase in MOSFET's reverse recovery. Moreover, in the MOSFET's reverse recovery, although there is current concentration on the contacts 32a present in the vicinity of the terminal regions, because of the larger width of the contacts 32a, it can be achieved to restrict the generation of heat to protect the semiconductor device 1 from being damaged.

Fifth Embodiment

A fifth embodiment is a combination of the above-described second and fourth embodiments, with a modification of the semiconductor device 1 having the wide contacts 32c formed in the terminal part in the trench longitudinal direction according to the second embodiment, into a trench field-plate structure.

Figure 38:
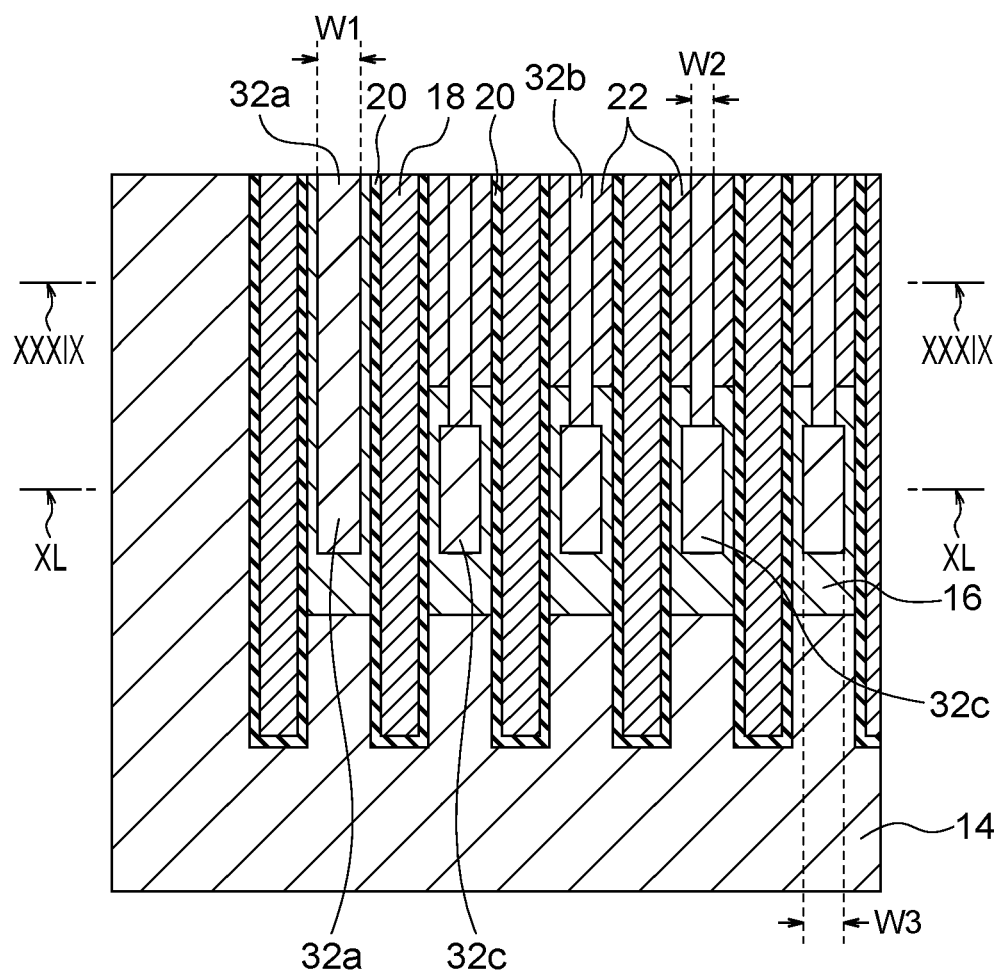
FIG. 38 is a sectional view of a semiconductor device according to a fifth embodiment in a front surface direction.
Figure 39:
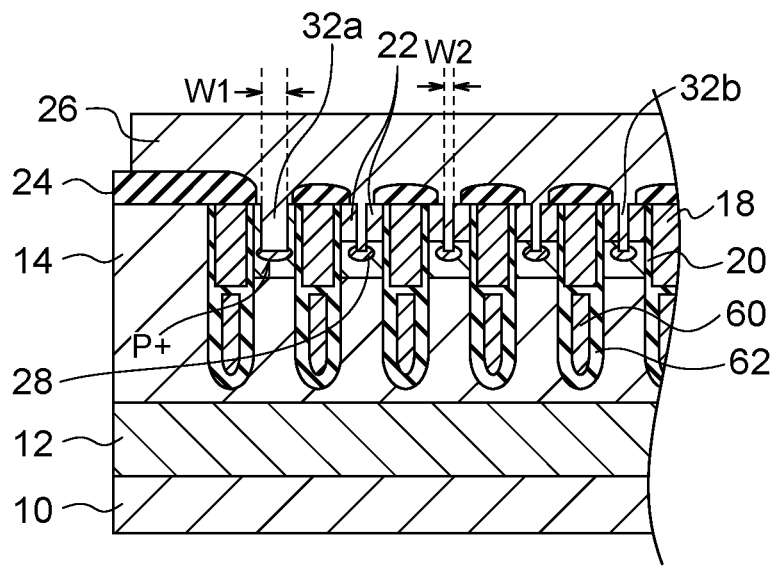
FIG. 39 is a sectional view taken on line XXXIX-XXXIX in FIG. 38 of the semiconductor device according to the fifth embodiment.
Figure 40:
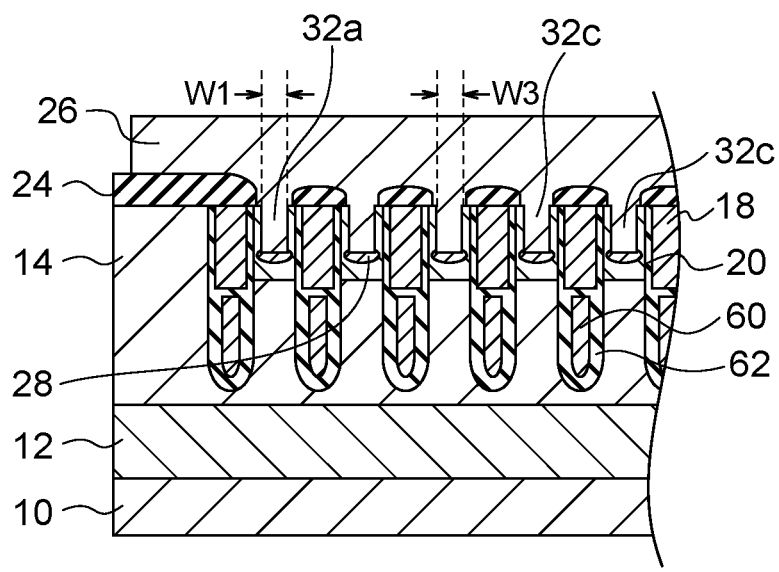
FIG. 40 is a sectional view taken on line XL-XL in FIG. 38 of the semiconductor device according to the fifth embodiment.

FIG. 38 is a sectional view of a semiconductor device 1 according to the present embodiment in the front surface direction, corresponding to FIG. 21 of the above-described fourth embodiment. FIG. 39 is a sectional view taken on line XXXIX-XXXIX in FIG. 38 of the semiconductor device 1 according to the present embodiment, corresponding to FIG. 22 of the above-described fourth embodiment. FIG. 40 is a sectional view taken on line XL-XL in FIG. 38 of the semiconductor device 1 according to the present embodiment, corresponding to FIG. 23 of the above-described fourth embodiment.

As shown in these FIGS. 38 to 40, the semiconductor device 1 according to the present embodiment is configured with field plate electrodes 60 added to the semiconductor device 1 according to the above-described second embodiment. In detail, the field plate electrodes 60 are embedded in the drift region 14 via field-plate insulating films 62. Although the field-plate insulating films 62 are formed to surround the field plate electrodes 60, respectively, the field plate electrodes 60 are electrically connected to the gate electrodes 18, respectively, or to the source electrode 26.

Also in the semiconductor device 1 according to the present embodiment, no source regions 22 are formed in the terminal part in the trench longitudinal direction. This is because, as described above, it is difficult to secure accuracy in optical lithography. For this reason, the contacts 32c present in the terminal part in the trench longitudinal direction have a larger width W3 than the width W2. The width W3 of the contacts 32c may be the same as or different from the width W1 of the contacts 32a. As described above, having the field plate electrodes 60 in the drift region 14, it can be achieved to reduce the resistance of the drift region 14 while raising the breakdown voltage of the semiconductor device 1. Moreover, having the wide contacts 32c in addition to the wide contacts 32a, it can be achieved to more easily discharge holes from the contacts 32c of the source electrode 26 to reduce the hole discharge resistance, in this MOSFET's reverse recovery.

Sixth Embodiment

A sixth embodiment is a combination of the above-described third and fourth embodiments, with a modification of the semiconductor device 1 having wide contacts 32c formed in the terminal part in the trench longitudinal direction according to the third embodiment, into a trench field-plate structure. From a different point of view, the sixth embodiment is a modified version of the above-described fifth embodiment, in which the contacts 32 in the semiconductor device 1 of the fifth embodiment are formed, not with a metal, but with a p$^+$-type semiconductor region.

Figure 41:
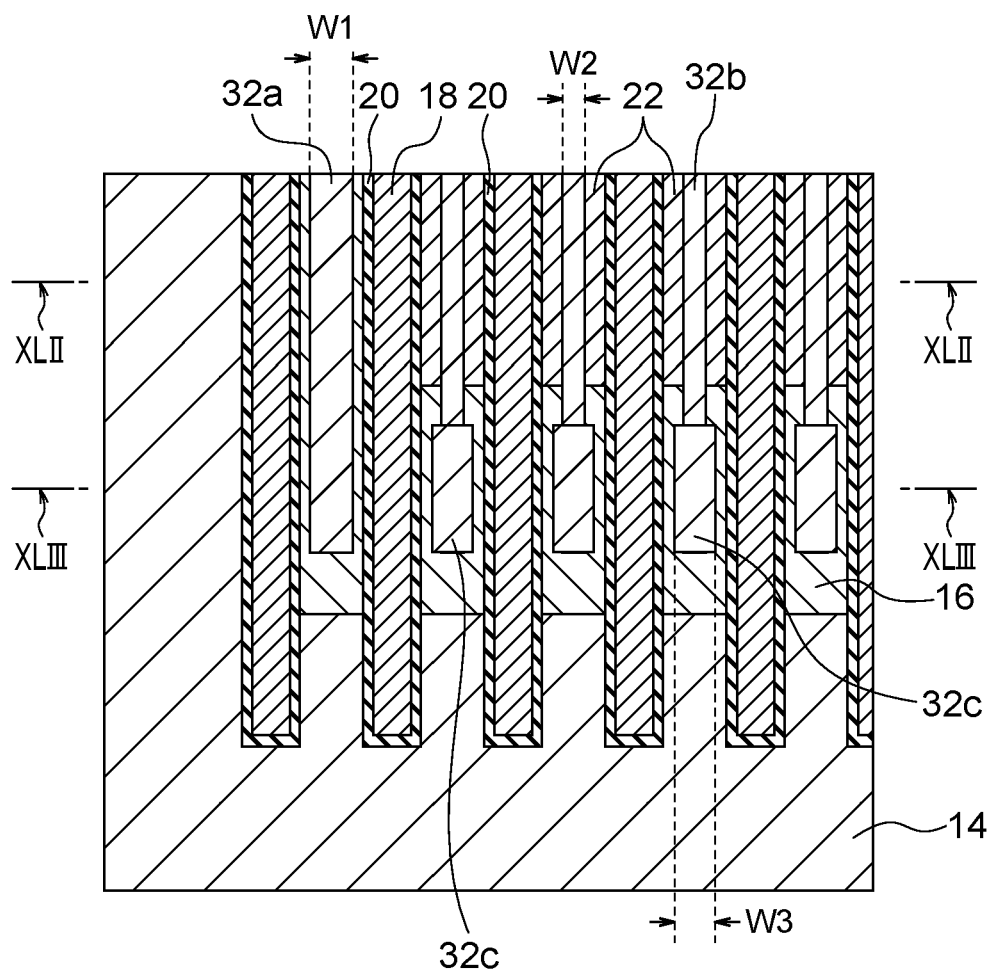
FIG. 41 is a sectional view of a semiconductor device according to a sixth embodiment in a front surface direction.
Figure 42:
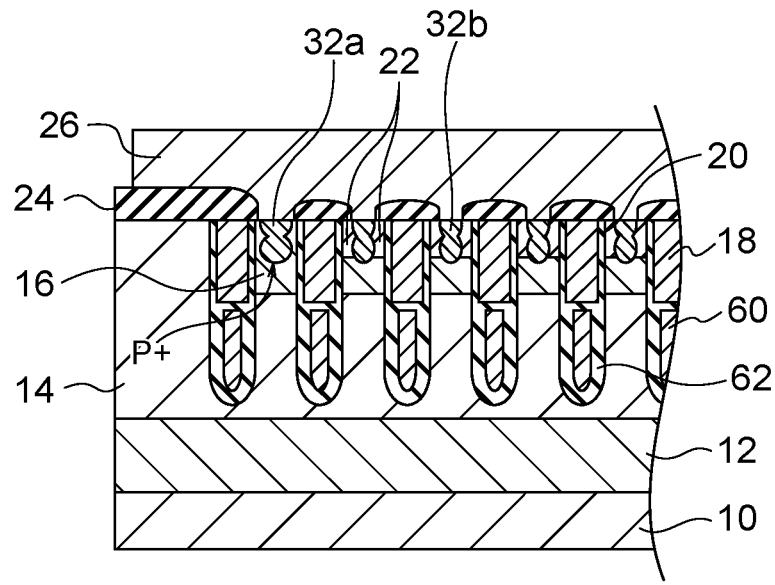
FIG. 42 is a sectional view taken on line XLII-XLII in FIG. 41 of the semiconductor device according to the sixth embodiment.
Figure 43:
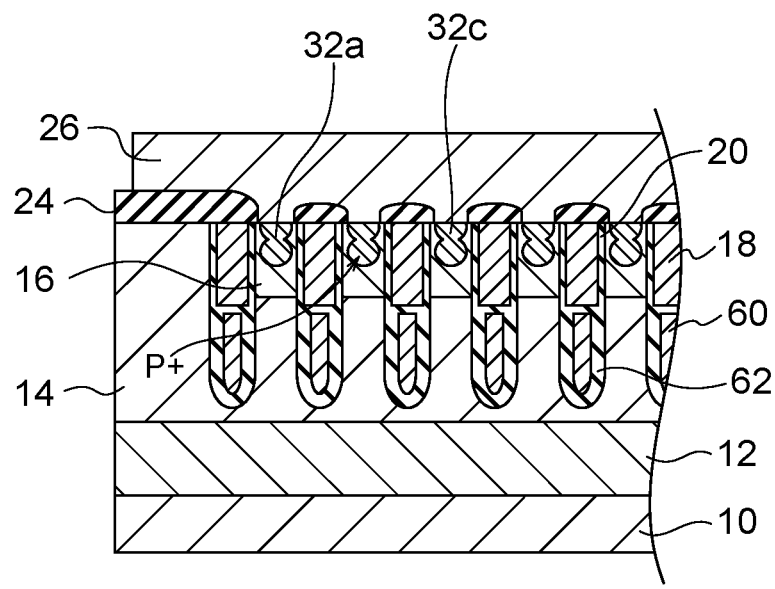
FIG. 43 is a sectional view taken on line XLIII-XLIII in FIG. 41 of the semiconductor device according to the sixth embodiment.

FIG. 41 is a sectional view of a semiconductor device 1 according to the present embodiment in the front surface direction, corresponding to FIG. 21 of the above-described fourth embodiment. FIG. 42 is a sectional view taken on line XLII-XLII in FIG. 41 of the semiconductor device 1 according to the present embodiment, corresponding to FIG. 22 of the above-described fourth embodiment. FIG. 43 is a sectional view taken on line XLIII-XLIII in FIG. 41 of the semiconductor device 1 according to the present embodiment, corresponding to FIG. 23 of the above-described fourth embodiment.

As shown in these FIGS. 41 to 43, the semiconductor device 1 according to the present embodiment is configured with field plate electrodes 60 added to the semiconductor device 1 according to the above-described third embodiment. In detail, the field plate electrodes 60 are embedded in the drift region 14 via field-plate insulating films 62. Although the field-plate insulating films 62 are formed to surround the field plate electrodes 60, respectively, the field plate electrodes 60 are electrically connected to the gate electrodes 18, respectively, or to the source electrode 26.

In the semiconductor device 1 according to the present embodiment, the contacts 32, which electrically connect the source electrode 26 and the base regions 16, are formed with a p$^+$-type semiconductor region. In detail, in the above-described fifth embodiment, the contacts 32 are formed with the metal that forms the source electrode 26, whereas, in the present embodiment, the contacts 32 are formed with a p$^+$-type semiconductor region formed by multistage ion implantation or the like to the base regions 16.

In the same manner as described above, a contact 32c is formed in the terminal part of each contact 32 in the trench longitudinal direction. The contact 32c is also formed with a p$^+$-type semiconductor region. The width of the contact 32c is the width W3 that is larger than the width W2, in the same manner as described above. The width W3 of the contact 32c may be the same as or different from the width W1 of each contact 32a.

As described above, having the field plate electrodes 60 in the drift region 14, it can be achieved to reduce the resistance of the drift region 14 while raising the breakdown voltage of the semiconductor device 1. Moreover, having the wide contacts 32c in addition to the wide contacts 32a, it can be achieved to more easily discharge holes from the contacts 32c of the source electrode 26 to reduce the discharge resistance, in this MOSFET's reverse recovery.

The contacts 32a, 32b and 32c according to the present embodiment correspond to a third semiconductor region.

Seventh Embodiment

A seventh embodiment is to form the contacts 32a of the width W1 in the mesa portions having no cells C formed therein, in the vicinity of the terminal regions, deeper than the contacts 32b of the width W2 in the mesa portions having cells C formed therein, aiming for further reduction of hole discharge resistance. Hereinbelow, the portion of the seventh embodiment different from the above-described fourth embodiment will be explained.

Figure 44:
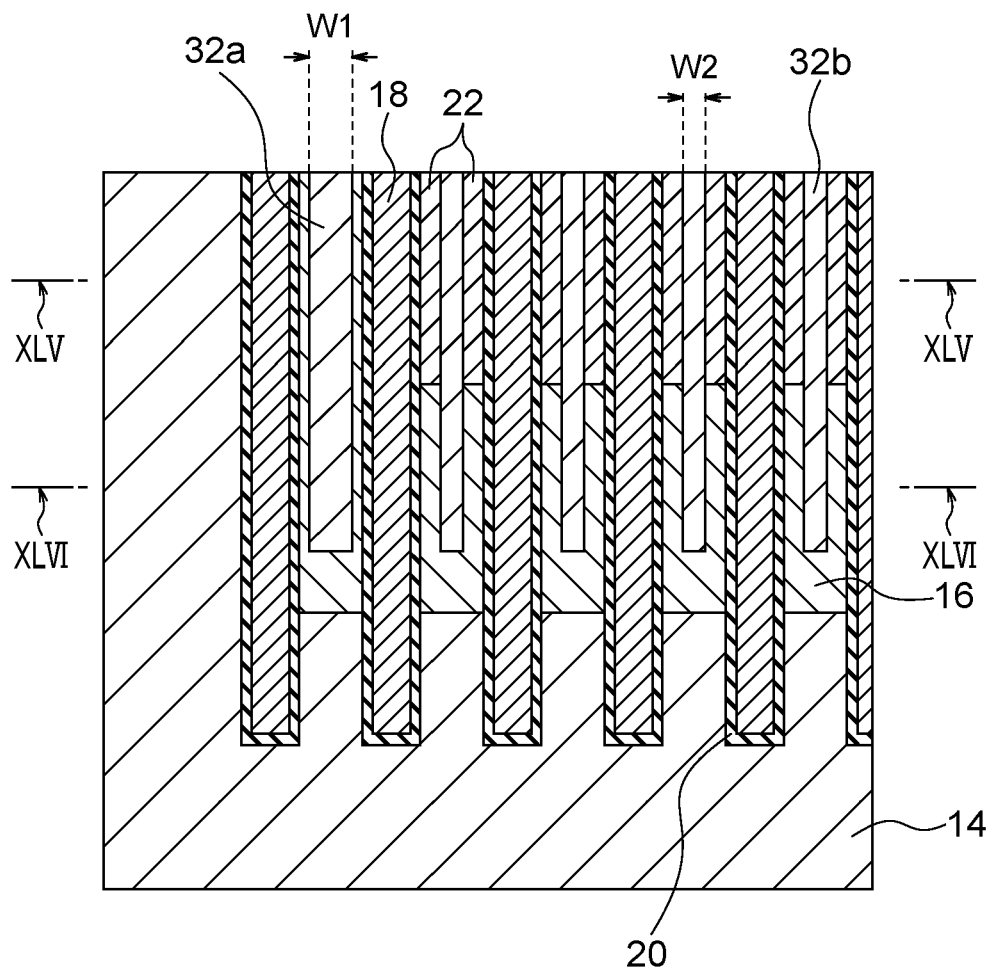
FIG. 44 is a sectional view of a semiconductor device according to a seventh embodiment in a front surface direction.
Figure 45:
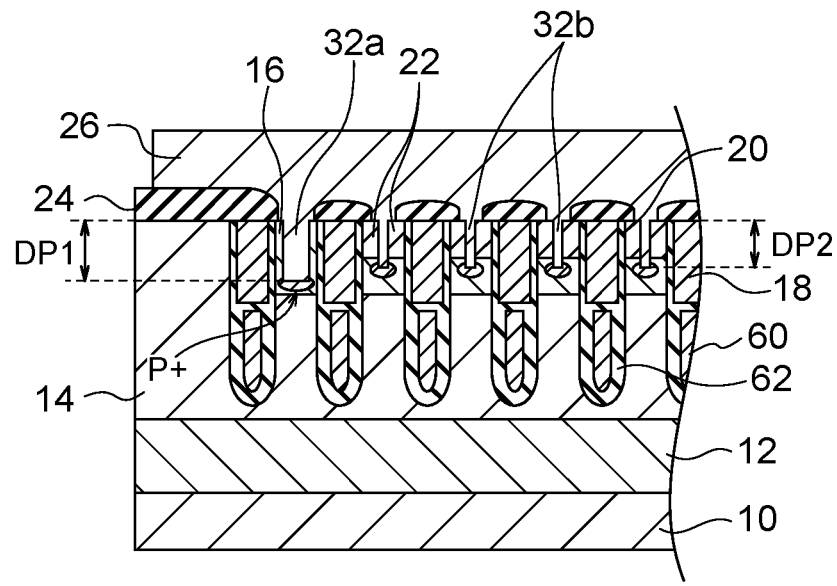
FIG. 45 is a sectional view taken on line XLV-XLV in FIG. 44 of the semiconductor device according to the seventh embodiment.
Figure 46:
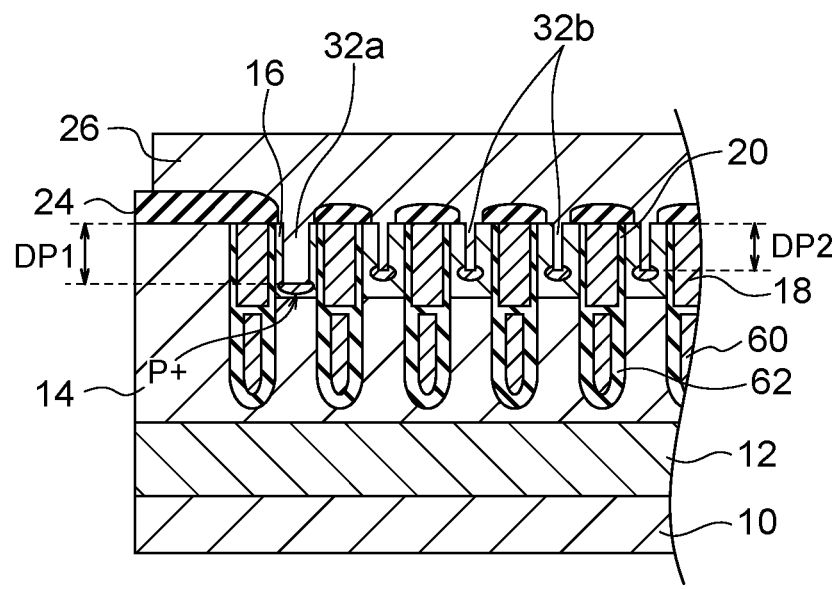
FIG. 46 is a sectional view taken on line XLVI-XLVI in FIG. 44 of the semiconductor device according to the seventh embodiment.

FIG. 44 is a sectional view of a semiconductor device 1 according to the present embodiment in the front surface direction, corresponding to FIG. 21 of the above-described fourth embodiment. FIG. 45 is a sectional view taken on line XLV-XLV in FIG. 44 of the semiconductor device 1 according to the present embodiment, corresponding to FIG. 22 of the above-described fourth embodiment. FIG. 46 is a sectional view taken on line XLVI-XLVI in FIG. 44 of the semiconductor device 1 according to the present embodiment, corresponding to FIG. 23 of the above-described fourth embodiment.

As shown in FIGS. 44 to 46, the contacts 32a of the source electrode 26, having the width W1, in the mesa portions having no source regions 22 formed therein, in the vicinity of the terminal regions, are formed deeper than the contacts 32b of the width W2 in the mesa portions having source regions 22 formed therein, that is, a depth DP1 of the contacts 32a is deeper than a depth DP2 of the contacts 32b. In other words, in the present embodiment, the depth DP2 of the contacts 32b is the same as the depth of the contacts 32b in the above-described fourth embodiment, whereas the depth DP1 of the contacts 32a is deeper than the depth of the contacts 32a in the above-described fourth embodiment.

As described above, the depth DP1 of the contacts 32a in the mesa portions having no source regions 22 formed therein, in the vicinity of the terminal regions, is larger than the depth DP2 of the contacts 32b in the mesa portions having source regions 22 formed therein, thereby achieving further reduction of hole discharge resistance. In detail, it can be achieved to easily discharge holes from the contacts 32a with a large width and formed deeper to reduce the hole discharge resistance.

In order to form the contacts 32a of the depth DP1 in the vicinity of the terminal regions, in the fabrication process in FIGS. 33 to 36 of the fourth embodiment, the trenches 30 for the formation of the contacts 32a and the trenches 30 for the formation of the contacts 32b may be formed to have the depth DP1 and the depth DP2, respectively. Another option is that, since the openings 52a of the photoresist 52 for the formation of the trenches 30 of the contacts 32a are wider than the openings 52b of the photoresist 52 for the formation of the trenches 30 of the contacts 32b, the base regions 16 may be simultaneously etched through the openings 52a and 52b so that the trenches 30 of the contacts 32a can be formed deeper than the trenches 30 of the contacts 32b.

Eighth Embodiment

An eighth embodiment is a combination of the above-described second and seventh embodiments, with a modification of the semiconductor device 1 according to the seventh embodiment, to form wide contacts 32c in the terminal part of the contacts 32 in the trench longitudinal direction. Hereinbelow, the portion of the eighth embodiment different from the above-described seventh embodiment will be explained.

Figure 47:
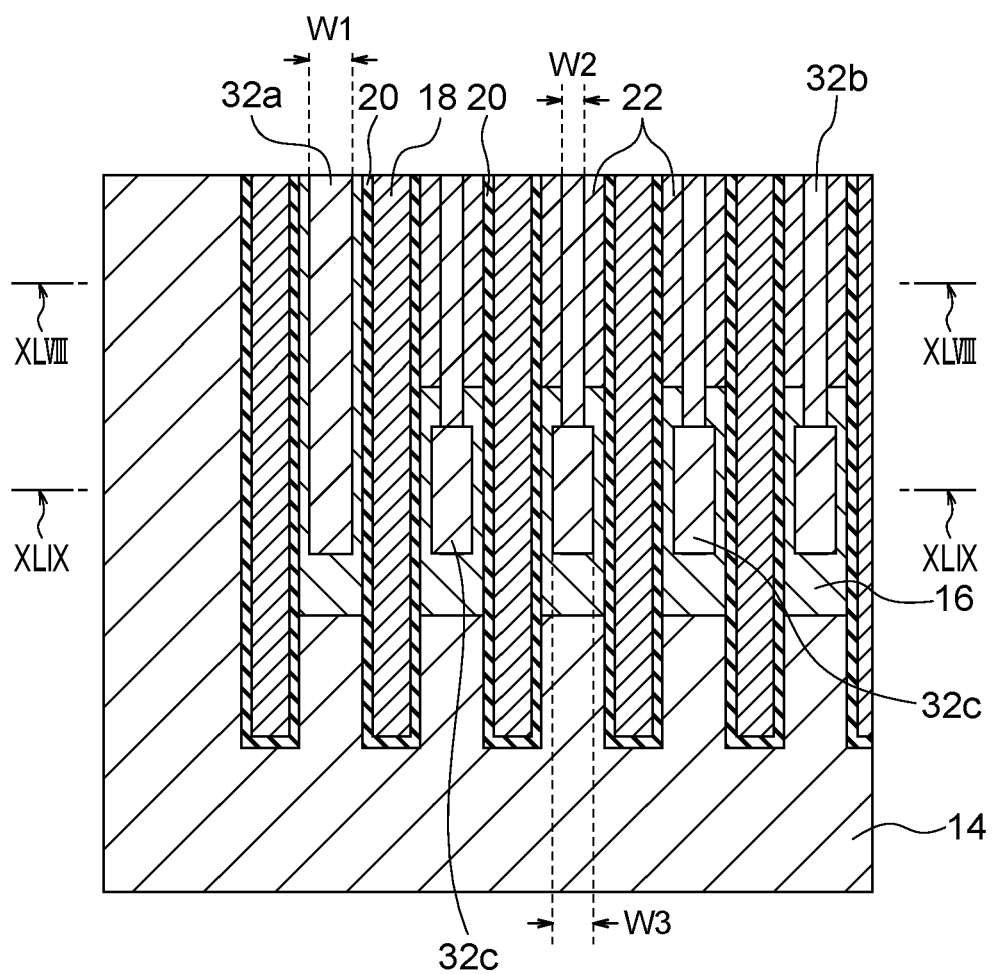
FIG. 47 is a sectional view of a semiconductor device according to an eighth embodiment in a front surface direction.
Figure 48:
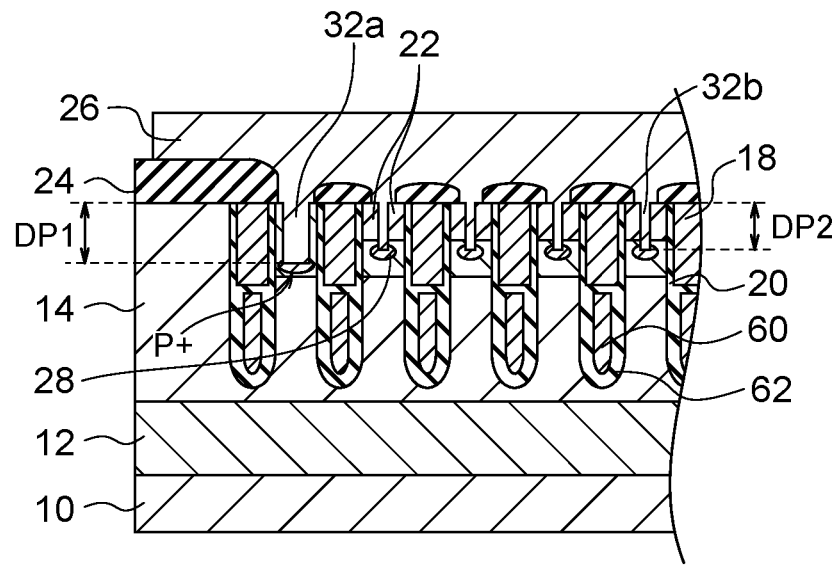
FIG. 48 is a sectional view taken on line XLVIII-XLVIII in FIG. 47 of the semiconductor device according to the eighth embodiment.
Figure 49:
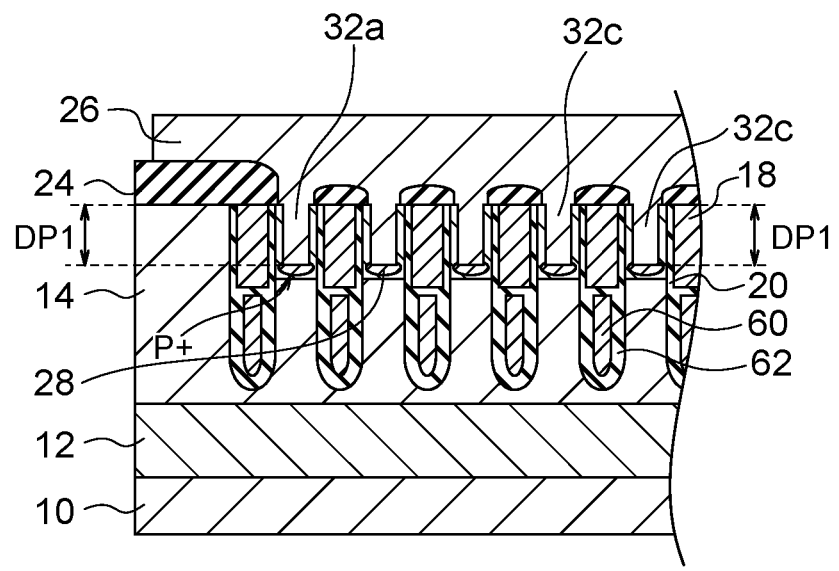
FIG. 49 is a sectional view taken on line XLIX-XLIX in FIG. 47 of the semiconductor device according to the eighth embodiment.

FIG. 47 is a sectional view of a semiconductor device 1 according to the present embodiment in the front surface direction, corresponding to FIG. 44 of the above-described seventh embodiment. FIG. 48 is a sectional view taken on line XLVIII-XLVIII in FIG. 47 of the semiconductor device 1 according to the present embodiment, corresponding to FIG. 45 of the above-described seventh embodiment. FIG. 49 is a sectional view taken on line XLIX-XLIX in FIG. 47 of the semiconductor device 1 according to the present embodiment, corresponding to FIG. 46 of the above-described seventh embodiment.

As shown in FIGS. 47 to 49, in the semiconductor device 1 according to the present embodiment, the width of the contacts 32c in the terminal part in the trench longitudinal direction is the width W3 larger than the width W2 in the same manner as the second embodiment. The width W3 of the contacts 32c may be the same as or different from the width W1 of the contacts 32a. Moreover, in the present embodiment, the depth DP1 with which the contacts 32c are formed is the same as the depth DP1 with which the contacts 32a are formed.

However, the depth with which the contacts 32c are formed and the depth with which the contacts 32a are formed may be different from each other. In other words, it is enough that the depth with which the contacts 32c are formed and the depth with which the contacts 32a are formed are respectively deeper than the depth with which the contacts 32b are formed.

Accordingly, in reverse recovery of MOSFET, holes can be discharged, not only from the contacts 32a of the source electrode 26, but also from the contacts 32c. Therefore, the holes can be more easily discharged to reduce hole discharge resistance. Accordingly, the breakdown of the gate insulating films 20 rarely occurs, which otherwise occur due to the voltage increase in MOSFET's reverse recovery. Moreover, in the MOSFET's reverse recovery, it can be achieved to restrict current concentration on the contacts 32a present in the vicinity of the terminal regions to protect the semiconductor device 1 from being damaged.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the example explained in each of the above-described embodiments is that one mesa portion having no source regions 22 formed therein, which is present in the terminal region, is provided on each side in the orthogonal-to-trench direction. However, any number of mesa portions having no source regions 22 formed therein can be provided. For example, when there are two mesa portions having no source regions 22 formed therein are provided on each side in the orthogonal-to-trench direction, a contact 32a having the large width W1 may be formed in each of the two mesa portions.

The invention claimed is:

1. A semiconductor device comprising:
    a first semiconductor region of a first conductive type;
    a base region of a second conductive type on the first semiconductor region;
    a plurality of gate electrodes penetrating through the base region to reach the first semiconductor region;
    a plurality of gate insulating films around the plurality of gate electrodes, respectively;
    a first region having a source region of the first conductive type, the first region among a plurality of regions between the plurality of gate insulating films and being surrounded by two of the plurality of gate insulating films;
    a second region not having the source region among the plurality of regions, the second region being located in a terminal region next to the first region and being surrounded by two of the plurality of gate insulating films;
    a first contact of a first width in the first region and electrically connecting the base region and a source electrode; and
    a second contact of a second width larger than the first width, the second contact being in the second region and electrically connecting the base region and the source electrode.

2. The semiconductor device according to claim 1, wherein the first and second contacts are formed of metal.

3. The semiconductor device according to claim 1 further comprising a third contact of a third width larger than the first width, the third contact being in a terminal part in a direction in which the first contact extends.

4. The semiconductor device according to claim 2 further comprising a third contact of a third width larger than the first width, the third contact being in a terminal part in a direction in which the first contact extends.

5. The semiconductor device according to claim 1, wherein the first and second contacts are formed with a second semiconductor region of the second conductive type.

6. The semiconductor device according to claim 1 further comprising a plurality of field plate electrodes embedded in the first semiconductor region under the plurality of gate electrodes, respectively.

7. The semiconductor device according to claim 6, wherein the plurality of field plate electrodes are electrically connected to the plurality of gate electrodes or the source electrode.

8. The semiconductor device according to claim 6, wherein a field-plate insulating film is formed around the plurality of field plate electrodes, the field-plate insulating film being thicker than the gate insulating film.

9. The semiconductor device according to claim 7, wherein a field-plate insulating film is formed around the plurality of field plate electrodes, the field-plate insulating film being thicker than the gate insulating film.

10. The semiconductor device according to claim 3, wherein the first, second, and third contacts are formed with a third semiconductor region of the second conductive type.

11. The semiconductor device according to claim 1, wherein the second contact in the second region is deeper than the first contact in the first region.

12. The semiconductor device according to claim 2, wherein the second contact in the second region is deeper than the first contact in the first region.

13. A semiconductor device comprising:
a first semiconductor region of a first conductive type;
a base region of a second conductive type on the first semiconductor region;
a plurality of gate electrodes penetrating through the base region to reach the first semiconductor region;
a plurality of gate insulating films around the plurality of gate electrodes, respectively;
a first region having a source region of the first conductive type, among a plurality of regions between the plurality of gate insulating films;
a second region not having the source region among the plurality of regions, the second region being located in a terminal region of the first region;
a first contact of a first width in the first region and electrically connecting the base region and a source electrode;
a second contact of a second width larger than the first width, the second contact being in the second region and electrically connecting the base region and the source electrode; and
a third contact of a third width larger than the first width, the third contact being in a terminal part in a direction in which the first contact extends, wherein the second contact in the second region is deeper than the first contact in the first region, and
the third contact in the terminal part in the direction in which the first contact extends is deeper than the first contact in the first region.

* * * * *